US008423878B2

(12) United States Patent
Cheong et al.

(10) Patent No.: US 8,423,878 B2
(45) Date of Patent: Apr. 16, 2013

(54) MEMORY CONTROLLER AND MEMORY SYSTEM INCLUDING THE SAME HAVING INTERFACE CONTROLLERS GENERATING PARITY BITS

(75) Inventors: WooSeong Cheong, Yongin-si (KR); Bumseok Yu, Suwon-si (KR); Chanho Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 411 days.

(21) Appl. No.: 12/758,103

(22) Filed: Apr. 12, 2010

(65) Prior Publication Data
US 2010/0306631 A1    Dec. 2, 2010

(30) Foreign Application Priority Data
May 28, 2009    (KR) .................. 10-2009-0047105

(51) Int. Cl.
*G06F 11/00*    (2006.01)
(52) U.S. Cl.
USPC .......................................... 714/805; 714/820

(58) Field of Classification Search .................. 714/768, 714/773, 805, 807, 820, 821
See application file for complete search history.

(56) References Cited

U.S. PATENT DOCUMENTS

| | | | |
|---|---|---|---|
| 7,234,099 B2 * | 6/2007 | Gower et al. ................. | 714/767 |
| 7,483,321 B2 | 1/2009 | Lee | |
| 7,523,381 B2 * | 4/2009 | Eggleston et al. ............ | 714/773 |
| 8,082,482 B2 * | 12/2011 | Gower et al. ................. | 714/763 |
| 2006/0047899 A1 * | 3/2006 | Ilda et al. ..................... | 711/113 |
| 2009/0063922 A1 * | 3/2009 | Gower et al. ................. | 714/746 |

FOREIGN PATENT DOCUMENTS

| | | |
|---|---|---|
| JP | 2008192054 | 8/2008 |
| JP | 2008192108 | 8/2008 |
| KR | 1020060122517 A | 11/2006 |

* cited by examiner

*Primary Examiner* — Scott Baderman
*Assistant Examiner* — Elmira Mehrmanesh
(74) *Attorney, Agent, or Firm* — Volentine & Whitt, PLLC

(57) ABSTRACT

A memory controller includes first and second interface controllers configured to exchange data with external devices, and an internal block connected between the first and second interface controllers. The first and second interface controllers exchange data received from the external devices and at least one parity bit corresponding to the received data through the internal block.

14 Claims, 15 Drawing Sheets

MEMORY CONTROLLER AND MEMORY SYSTEM INCLUDING THE SAME HAVING INTERFACE CONTROLLERS GENERATING PARITY BITS

PRIORITY STATEMENT

A claim of priority is made under 35 U.S.C. §119 to Korean Patent Application No. 10-2009-0047105, filed on May 28, 2009, in the Korean Intellectual Property Office, the subject matter of which is hereby incorporated by reference.

BACKGROUND

The present disclosure relates to semiconductor memory devices, and more particularly, to a memory controller of a semiconductor memory device and a memory system including the memory controller.

Semiconductor memory devices are memory devices implemented using a semiconductor, such as silicon. Semiconductor memory devices are classified as volatile memory devices or nonvolatile memory devices.

The volatile memory devices lose stored data when the power supply is interrupted. Examples of the volatile memory devices include static random access memory (SRAM) devices, dynamic random access memory (DRAM) devices, and synchronous dynamic random access memory (SDRAM) devices. The nonvolatile memory devices retain stored date even when the power supply is interrupted. Examples of the nonvolatile memory devices include read-only memory (ROM) devices, programmable read-only memory (PROM) devices, erasable programmable read-only memory (EPROM) devices, electrically erasable programmable read-only memory (EEPROM) devices, flash memory devices, phase-change random access memory (PRAM) devices, magnetic random access memory (MRAM) devices, resistive random access memory (RRAM) devices, and ferroelectric random access memory (FRAM) devices. The flash memory devices are classified as NOR-type flash memory devices or NAND-type flash memory devices.

A semiconductor memory is connected to a memory controller. The memory controller provides an interface between a host and the semiconductor memory. The memory controller is configured to control an operation of the semiconductor memory.

SUMMARY

Embodiments of the inventive concept provide a memory controller capable of detecting an error in data transmission, and a memory system including the memory controller.

In embodiments of the inventive concept, a memory controller includes first and second interface controllers configured to exchange data with external devices, and an internal block connected between the first and second interface controllers. The first and second interface controllers exchange data received from the external devices and at least one parity bit corresponding to the received data through the internal block.

Each of the first and second interface controllers may be configured to generate at least one parity bit corresponding to the received data and to transmit the received data and the corresponding at least one parity bit to the internal block.

Each of the first and second interface controllers may be configured to receive at least one external parity bit corresponding to the received data. A section for transmission of the received at least one external parity bit and a section for transmission of the generated at least one parity bit may have an overlapping section on a signal path in each of the first and second interface controllers.

The internal block may include first and second signal paths, the received data being transmitted on the first signal path with a first parity bit and the received data being transmitted on the second signal path with a second parity bit. The first signal path and the second signal path may have an overlapping section.

The overlapping section may include a data discontinuity block. The data discontinuity block may be an interface for exchanging data with an external device, a data unit setting block, a data encoding/decoding circuit or a storage circuit, for example.

The internal block may include a first parity control block configured to receive first data and at least one first parity bit from the first interface controller and decode the received at least one parity bit, and a data encoding/decoding block configured to encode the received first data and decode the encoded first data. The first parity control block may be further configured to check the decoded first data according to the received at least one parity bit.

The internal block may further include a second parity control block configured to generate at least one second parity bit based on the encoded first data and transmit the encoded first data and the generated at least one second parity bit to the second interface controller.

The second parity control block may be further configured to receive second data and at least one third parity bit from the second interface controller and decode the received at least one third parity bit. The data encoding/decoding block may be further configured to decode the received second data and encode the decoded second data. The second parity control block may be further configured to check the encoded second data according to the received at least one third parity bit.

The first parity control block may be further configured to generate at least one fourth parity bit based on the decoded second data and transmit the decoded second data and the generated at least one fourth parity bit to the first interface controller.

In further embodiments of the inventive concept, a memory system includes a memory device and a controller configured to control the memory device. The controller includes first and second interface controllers configured to exchange data with external devices, and an internal block connected between the first and second interface controllers. The first and second interface controllers exchange data received from the external devices and at least one parity bit corresponding to the received data through the internal block.

The memory device and the controller may compose a solid state drive (SSD) or a memory card.

In further embodiments of the inventive concept, a memory controller includes a first signal path configured to transmit data with at least one first parity bit, and a second signal path configured to transmit the data with at least one second parity bit. The first and second signal paths have an overlapping section.

BRIEF DESCRIPTION OF THE DRAWINGS

The accompanying drawings are included to provide a further understanding of the inventive concept, and are incorporated in and constitute a part of this specification. Exemplary embodiments of the inventive concept will be described with reference to the attached drawings, in which.

DETAILED DESCRIPTION OF THE EMBODIMENTS

Figure 1:
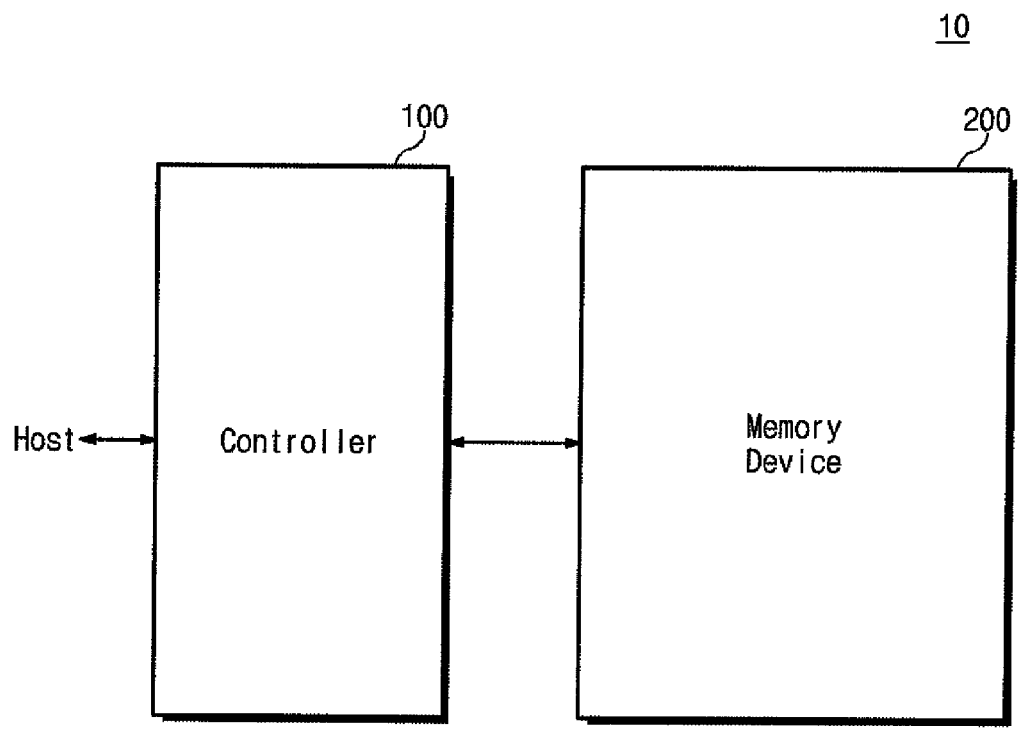
FIG. 1 is a block diagram of a memory system, according to an embodiment.

Various embodiments of the inventive concept will now be described more fully with reference to the accompanying drawings, in which illustrative embodiments are shown. The inventive concept, however, may be embodied in various different forms, and should not be construed as being limited only to the illustrated embodiments. Rather, these embodiments are provided as examples, to convey the inventive concept to one skilled in the art. Accordingly, known processes, elements, and techniques are not described with respect to some of the embodiments. Throughout the drawings and written description, like reference numerals will be used to refer to like or similar elements.

FIG. 1 is a block diagram of a memory system 10, according to an embodiment of the inventive concept.

Referring to FIG. 1, the memory system 10 includes a controller 100 and a memory device 200, according to an embodiment of the inventive concept.

The controller 100 is connected to a host and the memory device 200. The controller 100 is configured to access the memory device 200 in response to a request from the host. For example, the controller 100 may be configured to control read/write/erase operations of the memory device 200. As another example, the controller 100 may be configured to provide an interface between the memory device 200 and the host. As another example, the controller 100 may be configured to drive firmware for controlling the memory device 200. The controller 100 is described in detail below with reference to FIG. 2.

The memory device 200 may include a memory cell array for storing data, a read/write circuit for reading/writing data from/in the memory cell array, an address decoder for decoding an address received from an external device and transferring the same to the read/write circuit, and a control logic circuit for controlling overall operation of the memory device 200. For example, the memory device may include a volatile memory device such as SRAM, DRAM and SDRAM, a flash memory device, such as ROM, PROM, EPROM and EEPROM, or a nonvolatile memory device such as PRAM, MRAM, RRAM and FRAM. The memory device 200 will be described in detail below with reference to FIG. 15.

The controller 100 and the memory device 200 may be integrated into one semiconductor device. For example, the controller 100 and the memory device 200 may be integrated into one semiconductor device to constitute a memory card, such as a PC card (e.g., PCMCIA (Personal Computer Memory Card International Association)), a compact flash card (CF), a smart media card (SM/SMC), a memory stick, a multimedia card (e.g., MMC, RS-MMC and MMCmicro), a SD card (e.g., SD, miniSD, microSD and SDHC), or a universal flash storage (UFS).

As another example, the controller 100 and the memory device 200 may be integrated into one semiconductor device to constitute a solid state drive (SSD). The SSD may include a storage device configured to store data in a semiconductor memory. When the memory system 10 is used as an SSD, the operation speed of the host connected to the memory system 10 may increase significantly.

As another example, the memory system 10 may be applicable to computers, portable computers, UMPCs (Ultra Mobile PCs), workstations, net-books, PDAs, portable computers, web tablets, wireless phones, mobile phones, smart phones, digital cameras, digital audio recorders, digital audio players, digital picture recorders, digital picture players, digital video recorders, digital video players, devices capable of transmitting/receiving information in wireless environments, one of various electronic devices constituting a home network, one of various electronic devices constituting a computer network, one of various electronic devices constituting a telematics network, or one of various components constituting a computing system (e.g., an SSD and a memory card).

As another example, the memory device 200 or the memory system 10 may be mounted in various types of packages. Examples of packages that may include the memory device 200 or the memory system 10 include Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Figure 2:
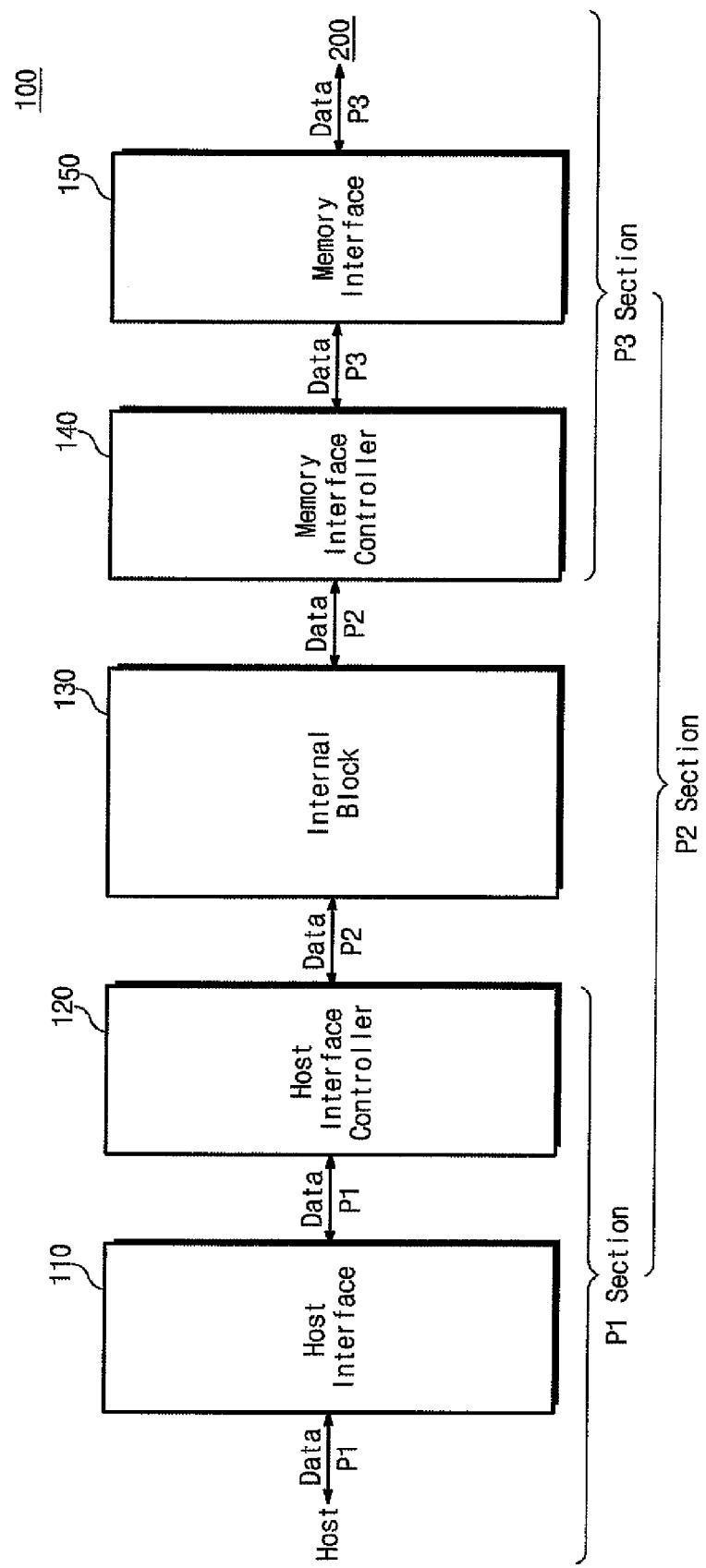
FIG. 2 is a block diagram illustrating an embodiment 1 of a controller of FIG. 1, according to an embodiment.

FIG. 2 is a block diagram illustrating an embodiment of the controller 100 of FIG. 1, according to an embodiment.

Referring to FIG. 2, the controller 100 includes a host interface 110, a host interface controller 120, an internal block 130, a memory interface controller 140, and a memory interface 150.

The host interface 110 is configured to exchange data with an external device, such as the host, for example. The host interface 110 includes a protocol for communication with the host. For example, the host interface 110 may include one of various interface protocols, such as USB (Universal Serial Bus), MMC (Multimedia Card), PCI (Peripheral Component Interface), PCI-E (PCI-Express), ATA (Advanced Technology Attachment), Serial-ATA, Parallel-ATA, SCSI (Small Computer Small Interface), ESDI (Enhanced Small Disk Interface), and IDE (Integrated Drive Electronics). The host interface 110 may communicate with the host on the basis of the protocol.

The host interface 110 is configured to exchange a first parity bit P1 with the external device. For example, the host interface 110 may be configured to exchange a first parity bit P1 with the host. The first parity bit P1 may be based on the protocol of the host interface 110, and the first parity bit P1 may correspond to the data exchanged with the host. Although "parity bit" is used throughout this description, the term is intended to include one or more parity bits associated with data, or a parity scheme, without departing from the scope of the present teachings.

The host may transfer data and the first parity bit P1 corresponding to the data to the host interface 110, for example. The host interface 110 is configured to output the data and the first parity bit P1, received from the host, to the host interface controller 120. The host interface 110 is also configured to receive data and a first parity bit P1 corresponding to the data from the host interface controller 120. The host interface 110 may transfer the data and the first parity bit P1, received from the host interface controller 120, to the host.

The host interface controller 120 is configured to exchange data and a first parity bit P1 with the host interface 110. The host interface controller 120 is also configured to exchange data and a second parity bit P2 corresponding to the data with the internal block 130. The host interface controller 120 is configured to use the received first or second parity bit P1 or P2 to detect an error in the received data. For example, the host interface controller 120 is configured to use the received first or second parity bit P1 or P2 to detect and correct an error in the received data. The host interface controller 120 is configured to generate the first or second parity bit P1 or P2 on the basis of the received data. The host interface controller 120 will be described below in detail with reference to FIGS. 3 and 4.

The internal block 130 is configured to receive data and the second parity bit P2 from the host interface controller 120. The internal block 130 is configured to output the received data and the second parity bit P2 to the memory interface controller 140. For example, the internal block 130 may include a buffer.

The memory interface controller 140 is configured to exchange data and the second parity bit P2 with the internal block 130. The memory interface controller 140 is also configured to exchange data and a third parity bit P3 corresponding to data with the memory interface 150. The memory interface controller 140 is configured to use the received second or third parity bit P2 or P3 to detect an error in the received data. The memory interface controller 140 is configured to use the received second or third parity bit P2 or P3 to detect and correct an error in the received data. The memory interface controller 140 is also configured to generate the second or third parity bit P2 or P3 on the basis of the received data. The memory interface controller 140 will be described below in detail with reference to FIGS. 5 and 6.

The memory interface 150 is configured to exchange data and the third parity bit P3 with the memory interface controller 140. The memory interface 150 is also configured to exchange data and the third parity bit P3 with an external device. For example, the memory interface 150 may be configured to exchange data and the third parity bit P3 with the memory device 200. The memory interface 150 includes a protocol for communication with the memory device 200. For example, when the memory device 200 is a NAND flash memory device, the memory interface 150 includes a NAND protocol.

As illustrated in FIG. 2, data and a first parity bit P1 are transferred through the host interface 110 to the host interface controller 120. It is understood that the host interface 110 and the host interface controller 120 form a first signal path for transmission of the data and the first parity bit P1. An error in the data on the first signal path may be detected using the first parity bit P1.

Data and a second parity bit P2 are transmitted from the host interface Controller 120 through the internal block 130 to the memory interface controller 140. That is, the host interface controller 120, the internal block 130, and the memory interface controller 140 from a second signal path for transmission of the data and the second parity bit P2. An error in the data on the second signal path may be detected using the second parity bit P2.

Data and a third parity bit P3 are transmitted through the memory interface 150 from the memory interface controller 140. That is, the memory interface controller 140 and the memory interface 150 form a third signal path for transmission of the data and the third parity bit P3. An error in the data on the third signal path may be detected using the third parity bit P3.

As illustrated in FIG. 2, the first signal path for transmission of the first parity bit P1 and the second signal path for transmission of the second parity bit P2 overlap each other in the host interface controller 120. Likewise, the second signal path for transmission of the second parity bit P2 and the third signal path for transmission of the third parity bit P3 overlap each other in the memory interface controller 140. The first to third parity bits P1~P3 may be used to detect an error in data on the signal path from the host interface 110 to the memory interface 150.

Figure 3:
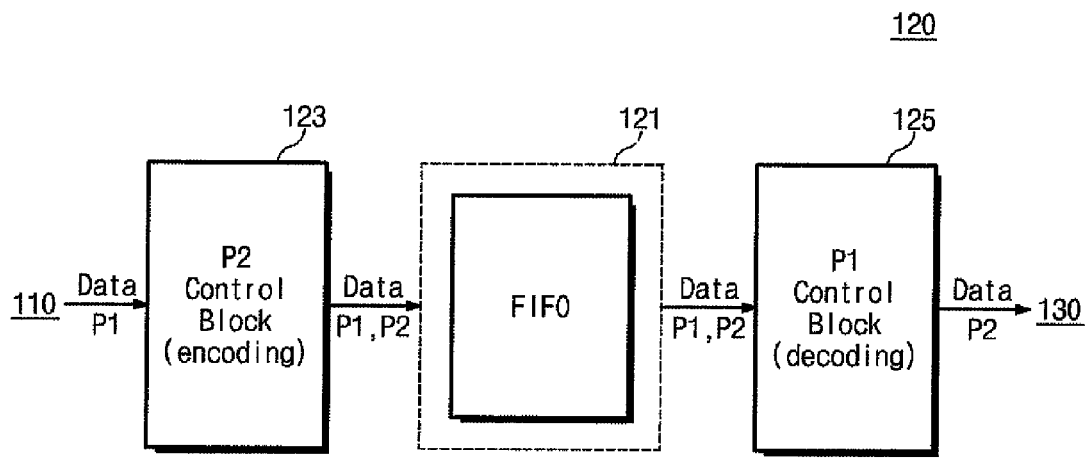
FIGS. 3 and 4 are block diagrams illustrating a host interface controller of FIG. 2, according to an embodiment.
Figure 4:
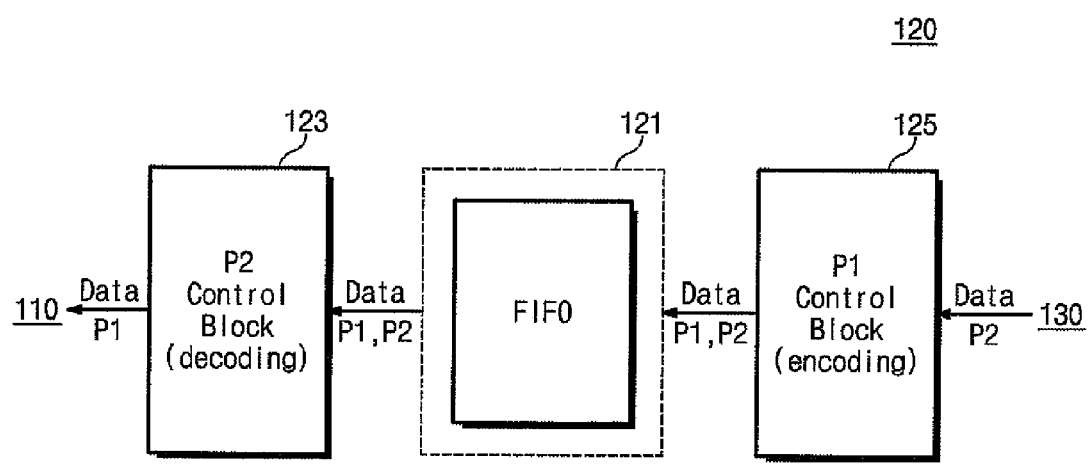

FIGS. 3 and 4 are block diagrams illustrating the host interface controller 120 of FIG. 2, according to an embodiment.

Referring to FIGS. 2 to 4, the host interface controller 120 includes an internal block 121, a second parity control block 123, and a first parity control block 125.

The internal block 121 provides a channel between the host interface 110 and the internal block 130. For example, the host interface 110 may operate in synchronization with the operation speed of the host, and the internal block 130 may operate in synchronization with an internal clock of the controller 100. The operation speed of the host and the operation speed of the internal block 130 may be different from each other. In an embodiment, the internal block 121 may perform a buffer operation between a data input/output (I/O) operation synchronized with the operation speed of the host and a data I/O operation synchronized with the operation speed of the internal block 130.

In the depicted embodiment, the internal block 121 includes a first-in first-out (FIFO) unit, for example. Data input in synchronization with the operation speed of the host may be sequentially stored in the FIFO unit, and the data stored in the FIFO unit may be sequentially output in synchronization with the operation speed of the internal block 130. Likewise, data input in synchronization with the operation speed of the internal block 130 may be sequentially stored in the FIFO unit, and the data stored in the FIFO unit may be sequentially output in synchronization with the operation speed of the host.

Generally, the second parity control block 123 is configured to receive data from an external device and to generate a parity bit corresponding to the received data. The second parity control block 123 is also configured to receive data and a parity bit corresponding to the data from the external device and to detect an error in the received data by means of the received parity bit. For example, the second parity control block 123 may be configured to detect/correct an error in the received data by means of the received parity bit. In the depicted embodiment, the parity bit generated/used by the second parity control block 123 is second parity bit P2.

Generally, the first parity control block 125 is configured to receive data from an external device and to generate a parity bit corresponding to the received data. The first parity control block 125 is also configured to receive data and a parity bit corresponding to the data from the external device and to detect an error in the received data by means of the received parity bit. For example, the first parity control block 125 may be configured to detect/correct an error in the received data by means of the received parity bit. In the depicted embodiment, the parity bit generated/used by the first parity control block 125 is a first parity bit P1.

Data received from the host are stored in the FIFO unit through the second parity control block 123. The data stored in the FIFO unit are transferred through the first parity control block 125 to the internal block 130. Data received from the internal block 130 are stored in the FIFO unit through the first parity control block 125. The data stored in the FIFO unit are transferred through the second parity control block 123 to the host interface 110.

A process for transferring data from the host through the host interface controller 120 to the internal block 130 is described below with reference to FIG. 3.

The host interface controller 120 is configured to receive data and a first parity bit P1 through the host interface 110 from the host. For example, the first parity bit P1 may be a parity bit according to the protocol for communication of the controller 100 with the host.

The second parity control block 123 is configured to receive the data and the first parity bit P1 from the host interface 110. The second parity control block 123 is configured to generate a second parity bit P2 corresponding to the received data on the basis of the received data. That is, the second parity control block 123 is configured to encode the received data. Together with the received data, the first and second parity bits P1 and P2 are transferred from the second parity control block 123 to the internal block 121.

The first parity control block 125 is configured to receive the data and the first and second parity bits P1 and P2 from the internal block 121. The first parity control block 125 is configured to detect an error in the received data by means of the received first parity bit P1. For example, the first parity control block 125 is configured to detect/correct an error in the received data by means of the received first parity bit P1. That is, the first parity control block 125 is configured to decode the received data by means of the received first parity bit P1.

When detecting an error in the received data, the first parity control block 125 may generate an error report message. For example, the error report message may be transferred to a processor (not illustrated) of the controller 100. The processor of the controller 100 performs a predetermined operation in response to the error report message. As another example, the error report message may be transferred to the host. The host performs a predetermined operation in response to the error report message.

For example, if an error is detected in the received data and the detected error is within a correctable range, the first parity control block 125 uses the received first parity bit P1 to correct the error in the received data. If an error is detected in the received data and the detected error is outside the correctable range, the first parity control block 125 outputs an error report message. If an error is not detected in the received data or if a detected error is corrected, the first parity control block 125 outputs the second parity bit P2 and the data. The second parity bit P2 and the data are transferred to the internal block 130.

A process for transferring data from the internal block 130 through the host interface controller 120 to the host is described below with reference to FIG. 4.

The host interface controller 120 is configured to receive data and a second parity bit P2 from the internal block 130.

The first parity control block 125 is configured to receive the data and the second parity bit P2 from the internal block 130. The first parity control block 125 is configured to generate a first parity bit P1 corresponding to the received data on the basis of the received data. That is, the first parity control block 125 is configured to encode the received data. Together with the received data, the first and second parity bits P1 and P2 are transferred from the first parity control block 125 to the internal block 121.

The second parity control block 123 is configured to receive the data and the first and second parity bits P1 and P2 from the internal block 121. The second parity control block 123 is configured to detect an error in the received data by means of the received second parity bit P2. For example, the second parity control block 123 is configured to detect/correct an error in the received data by means of the received second parity bit P2. That is, the second parity control block 123 is configured to decode the received data by means of the received second parity bit P2.

When detecting an error in the received data, the second parity control block 123 may generate an error report message. For example, the error report message may be transferred to a processor (not illustrated) of the controller 100. The processor of the controller 100 performs a predetermined operation in response to the error report message. As another example, the error report message may be transferred to the host. The host performs a predetermined operation in response to the error report message.

For example, if an error is detected in the received data and the detected error is within a correctable range, the second parity control block 123 uses the received second parity bit P2 to correct the error in the received data. If an error is detected in the received data and the detected error is outside the correctable range, the second parity control block 123 outputs an error report message. If an error is not detected in the received data or a detected error is corrected, the second parity control block 123 outputs the first parity bit P1 and the data. The first parity bit P1 and the data are transferred through the host interface 110 to the host.

Data input to the internal block 121 including the FIFO unit are stored in the FIFO unit prior to output. That is, the input data and the output data of the internal block 121 including the FIFO unit are discontinuous. It will be understood that the internal block 121 is a data discontinuity block. The data discontinuity block indicates that the input data and the output data of the block are discontinuous. That is, an input terminal and an output terminal of the data discontinuity block are not directly connected through the signal path. For example, in the internal block 121, the input data are stored in the FIFO unit and the data stored in the FIFO unit are output.

When the input data and the output data are discontinuous, an error may occur in the data discontinuity block. For example, when the data stored in the FIFO unit are output, the data output sequence of the FIFO unit may change due to the influence of noise or an error in hardware or software. When the data output sequence of the FIFO unit changes, the output data of the FIFO unit may contain an error. Likewise, the data stored in the FIFO unit may be inverted due to the influence of noise or an error in hardware or software. When the data stored in the FIFO unit are inverted, the output data of the FIFO unit may contain an error.

As described with reference to FIGS. 3 and 4, the first parity bit P1 is used to detect an error in the data transmitted from the second parity control block 123 through the internal block 121 to the first parity control block 125. The second parity bit P2 is used to detect an error in the data transmitted from the first parity control block 125 through the internal block 121 to the second parity control block 123.

It will be understood that an error detection section using a specific parity bit is a section capable of detecting an error in the section by means of the parity bit. In this case, an error detection section using the second parity bit P2 includes the second parity control block 123 and the internal block 121, and an error detection section using the first parity bit P1 includes the internal block 121 and the first parity control block 125. That is, the error detection sections using the first and second parity bits P1 and P2 overlap each other in the internal block 121.

Data received from the host interface 110 are stored in the FIFO unit of the host interface controller 120, and an error in the data is detected after the data are output from the FIFO unit. Data received from the internal block 130 are stored in the FIFO unit of the host interface controller 120, and an error in the data is detected after the data are output from the FIFO unit.

That is, when the error detection sections using the first and second parity bits P1 and P2 overlap each other in the internal block 121, an error in the internal block 121 can be detected as described with reference to FIGS. 3 and 4. In other words, an error in the data discontinuity block (e.g., the FIFO unit) can be detected by overlapping the error detection sections.

Figure 5:
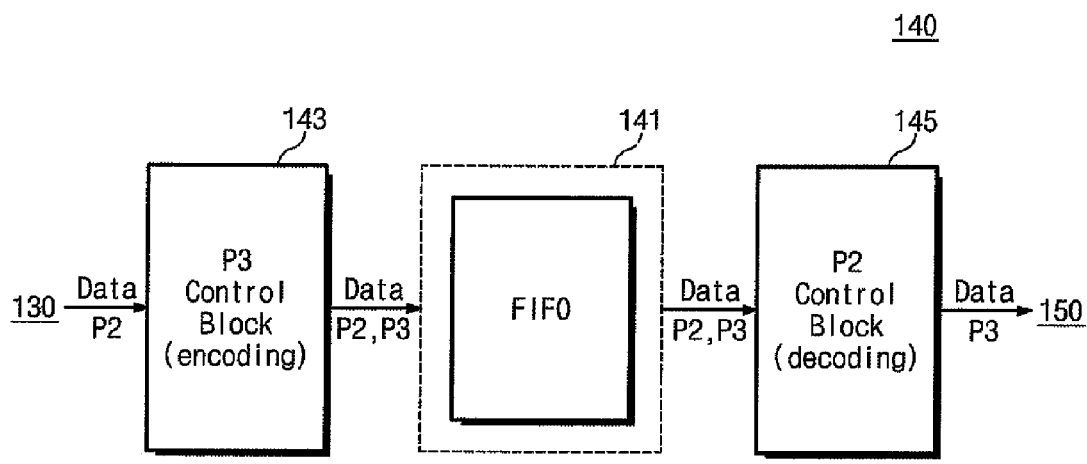
FIGS. 5 and 6 are block diagrams illustrating a memory interface controller of FIG. 2, according to an embodiment.
Figure 6:
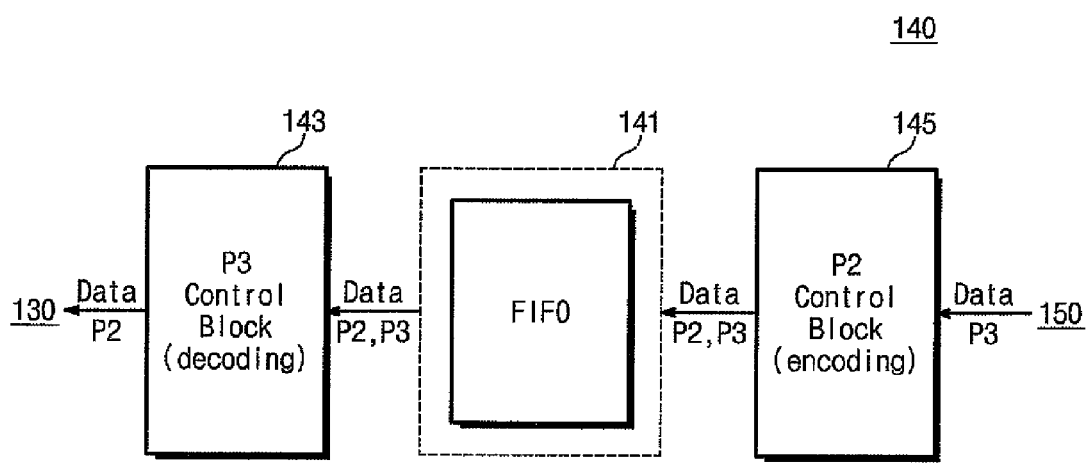

FIGS. 5 and 6 are block diagrams illustrating the memory interface controller 140 of FIG. 2, according to an embodiment.

Referring to FIGS. 2, 5 and 6, the memory interface controller 140 includes an internal block 141, a third parity control block 143, and a second parity control block 145.

The internal block 141 provides a channel between the memory interface 150 and the internal block 130. For example, the memory interface 150 may operate in synchronization with the operation speed of the memory device 200, and the internal block 130 may operate in synchronization with an internal clock of the controller 100. The operation speed of the memory device 200 and the operation speed of the internal block 130 may be different from each other. The internal block 141 may perform a buffer operation between a data I/O operation synchronized with the operation speed of the memory device 200 and a data I/O operation synchronized with the operation speed of the internal block 130.

For example, in the depicted embodiment, the internal block 141 includes a FIFO unit. Data input in synchronization with the operation speed of the memory device 200 may be sequentially stored in the FIFO unit. The data stored in the FIFO unit may be sequentially output in synchronization with the operation speed of the internal block 130. Likewise, data input in synchronization with the operation speed of the internal block 130 may be sequentially stored in the FIFO unit. The data stored in the FIFO unit may be sequentially output in synchronization with the operation speed of the memory device 200.

Generally, the third parity control block 143 is configured to receive data from an external device and to generate a parity bit corresponding to the received data. The third parity control block 143 is also configured to receive data and a parity bit corresponding to the data from an external device and to detect an error in the received data by means of the received parity bit. For example, the third parity control block 143 may be configured to detect/correct an error in the received data by means of the received parity bit. In the depicted embodiment, the parity bit generated/used by the third parity control block 143 is third parity bit P3.

Generally, the second parity control block 145 is configured to receive data from an external device and to generate a parity bit corresponding to the received data. The second parity control block 145 is also configured to receive data and a second parity bit P2 corresponding to the data from an external device and detect an error in the received data by means of the received second parity bit P2. For example, the second parity control block 145 may be configured to detect/correct an error in the received data by means of the received second parity bit P2.

Data received from the memory device 200 are stored in the FIFO unit through the second parity control block 145. The data stored in the FIFO unit are transferred through the third parity control block 143 to the internal block 130. Data received from the internal block 130 are stored in the FIFO unit through the third parity control block 143. The data stored in the FIFO unit are transferred through the second parity control block 145 to the memory interface 150.

A process for transferring data from the internal block 130 through the memory interface controller 140 to the memory device 200 will be described below with reference to FIG. 5.

The memory interface controller 140 is configured to receive data and a second parity bit P2 from the internal block 130. For example, the second parity bit P2 may be a parity bit generated by the second parity control block 123 described with reference to FIGS. 3 and 4.

The third parity control block 143 is configured to receive the data and the second parity bit P2 from the internal block 130. The third parity control block 143 is configured to generate a third parity bit P3 corresponding to the received data on the basis of the received data. That is, the third parity control block 143 is configured to encode the received data. Together with the received data, the second and third parity bits P2 and P3 are transferred from the third parity control block 143 to the internal block 141.

The second parity control block 145 is configured to receive the data and the second and third parity bits P2 and P3 from the internal block 141. The second parity control block 145 is configured to detect an error in the received data by means of the received second parity bit P2. For example, the second parity control block 145 is configured to detect/correct an error in the received data by means of the received second parity bit P2. That is, the second parity control block 145 is configured to decode the received data by means of the received second parity bit P2.

When detecting an error in the received data, the second parity control block 145 may generate an error report message. For example, the error report message may be transferred to a processor (not illustrated) of the controller 100. The processor of the controller 100 performs a predetermined operation in response to the error report message. As another example, the error report message may be transferred to the host. The host performs a predetermined operation in response to the error report message.

For example, if an error is detected in the received data and the detected error is within a correctable range, the second parity control block 145 uses the received second parity bit P2 to correct the error in the received data. If an error is detected in the received data and the detected error is outside the correctable range, the second parity control block 145 outputs an error report message. If an error is not detected in the received data or a detected error is corrected, the second parity control block 145 outputs the third parity bit P3 and the data. The third parity bit P3 and the data are transferred through the memory interface 150 to the memory device 200. The third parity bit P3 and the data are written in the memory device 200. For example, the third parity bit P3 may be generated according to the protocol for communication between the controller 100 and the memory device 200.

A process for transferring data from the memory device 200 through the memory interface controller 140 to the internal block 130 is described below with reference to FIG. 6.

The memory interface controller 140 is configured to receive data and a third parity bit P3 from the memory device 200. For example, the data and the third parity bit P3 read from the memory device 200 are received by the memory interface controller 140.

The second parity control block 145 is configured to receive the data and the third parity bit P3 from the memory interface 150. The second parity control block 145 is configured to generate a second parity bit P2 corresponding to the received data on the basis of the received data. That is, the second parity control block 145 is configured to encode the received data. Together with the received data the second and third parity bits P2 and P3 are transferred from the second parity control block 145 to the internal block 141.

The third parity control block 143 is configured to receive the data and the second and third parity bits P2 and P3 from the internal block 141. The third parity control block 143 is configured to detect an error in the received data by means of the received third parity bit P3. For example, the third parity control block 143 is configured to detect/correct an error in the received data by means of the received third parity bit P3. That is, the third parity control block 143 is configured to decode the received data by means of the received third parity bit P3.

When detecting an error in the received data, the third parity control block 143 generates an error report message. For example, the error report message may be transferred to a processor (not illustrated) of the controller 100. The processor of the controller 100 performs a predetermined operation in response to the error report message. As another example, the error report message may be transferred to the host. The host performs a predetermined operation in response to the error report message.

For example, if an error is detected in the received data and the detected error is within a correctable range, the third parity control block 143 uses the received third parity bit P3 to correct the error in the received data. If an error is detected in the received data and the detected error is outside the correctable range, the third parity control block 143 outputs an error report message. If an error is not detected in the received data or a detected error is corrected, the third parity control block 143 outputs the second parity bit P2 and the data. The second parity bit P2 and the data are transferred to the internal block 130.

As described with reference to FIGS. 5 and 6, the second parity bit P2 is used to detect an error in the data transmitted from the third parity control block 143 through the internal block 141 to the second parity control block 145. The third parity bit P3 is used to detect an error in the data transmitted from the second parity control block 145 through the internal block 141 to the third parity control block 143.

An error detection section using the third parity bit P3 includes the third parity control block 143 and the internal block 141, and an error detection section using the second parity bit P2 includes the internal block 141 and the second parity control block 145. That is, the error detection sections using the second and third parity bits P2 and P3 overlap each other in the internal block 141.

Data received from the memory interface 150 are stored in the FIFO unit of the memory interface controller 140, and an error in the data is detected after the data are output from the FIFO unit. Data received from the internal block 130 are stored in the FIFO unit of the memory interface controller 140, and an error in the data is detected after the data are output from the FIFO unit.

That is, when the error detection sections using the second and third parity bits P2 and P3 overlap each other in the internal block 141, an error in the internal block 141 can be detected as described with reference to FIGS. 5 and 6. In other words, an error in the data discontinuity block can be detected by overlapping the error detection sections.

Referring to FIGS. 2 to 6, the first parity bit P1 may be used to detect an error generated in the host interface 110 and the host interface controller 120. The third parity bit P3 may be used to detect an error generated in the memory interface 150 and the memory interface controller 140. The second parity bit P2 may be used to detect an error generated in the host interface controller 120, the internal block 130 and the memory interface controller 140.

The host interface controller 120 and the memory interface controller 140 are configured to exchange the parity bit (e.g., the second parity bit P2) with the internal block 130 and to detect an error in the internal block 130 by means of the exchanged parity bit (e.g., the second parity bit P2). In particular, the error detection sections overlap each other in the internal block 121 of the host interface controller 120 and the internal block 141 of the memory interface controller 140. Thus, it is possible to detect an error in the internal block 121 of the host interface controller 120 and the internal block 141 of the memory interface controller 140. The efficiency of detecting an error in the section between the host interface controller 120 and the memory interface controller 140, which are data discontinuity blocks, is improved. That is, the reliability of the controller 100 is improved.

Figure 7:
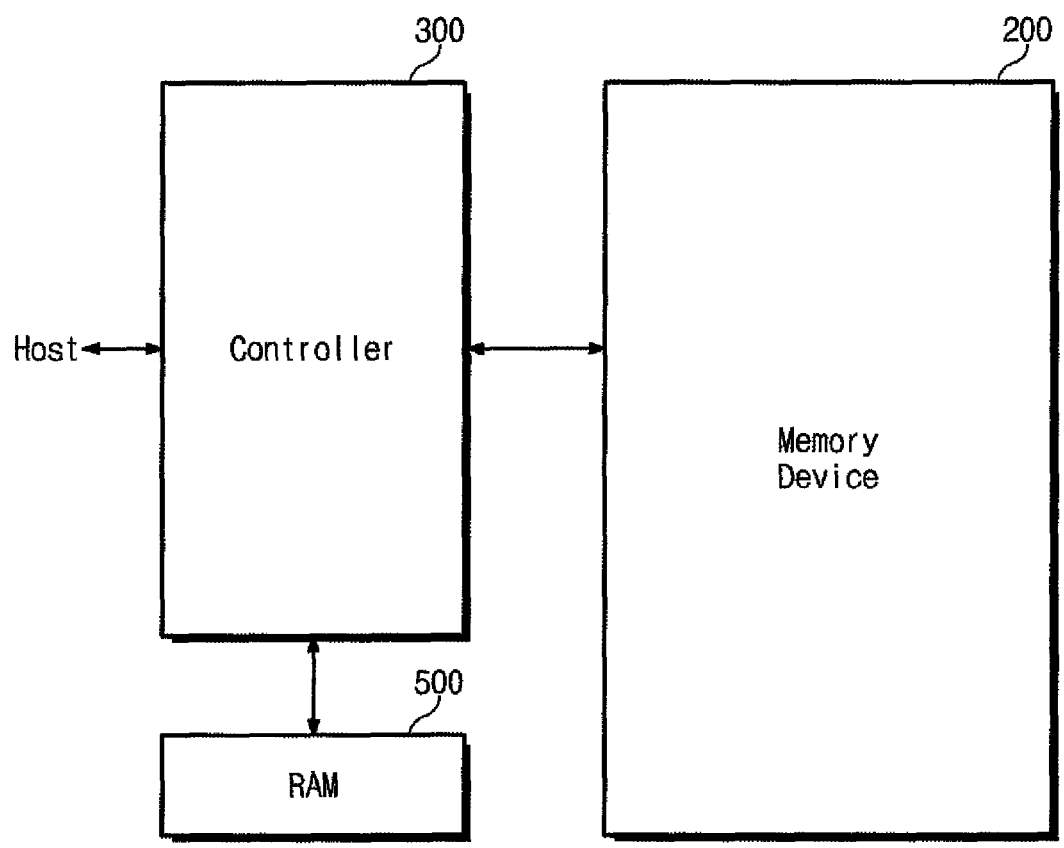
FIG. 7 is a block diagram of a memory system, according to an embodiment.

FIG. 7 is a block diagram of a memory system 20, according to an embodiment of the inventive concept.

Referring to FIG. 7, the memory system 20 includes a memory device 200, a controller 300, and a random access memory (RAM) 500.

The memory device 200 is configured to communicate with the controller 300. The memory device 200 will be described in detail below with reference to FIG. 11.

The controller 300 is configured to communicate with the memory device 200 and the RAM 500. The controller 300 is configured to store data in the memory device 200. The controller 300 will be described in detail below with reference to FIG. 8.

The RAM 500 is configured to communicate with the controller 300. The RAM 500 may include a volatile RAM or a nonvolatile RAM. An operation of the RAM 500 will be described in detail below with reference to FIG. 8.

The RAM 500 is depicted separate from the controller 300 and the memory device 200 in FIG. 7. However, the RAM 500 is not limited to this configuration, and may be implemented as one of the internal components of the controller 300, for example.

It is understood that the memory device 200, the controller 300 and the RAM 500 may constitute a memory card or a solid state drive (SSD), as described with reference to FIG. 1.

Figure 8:
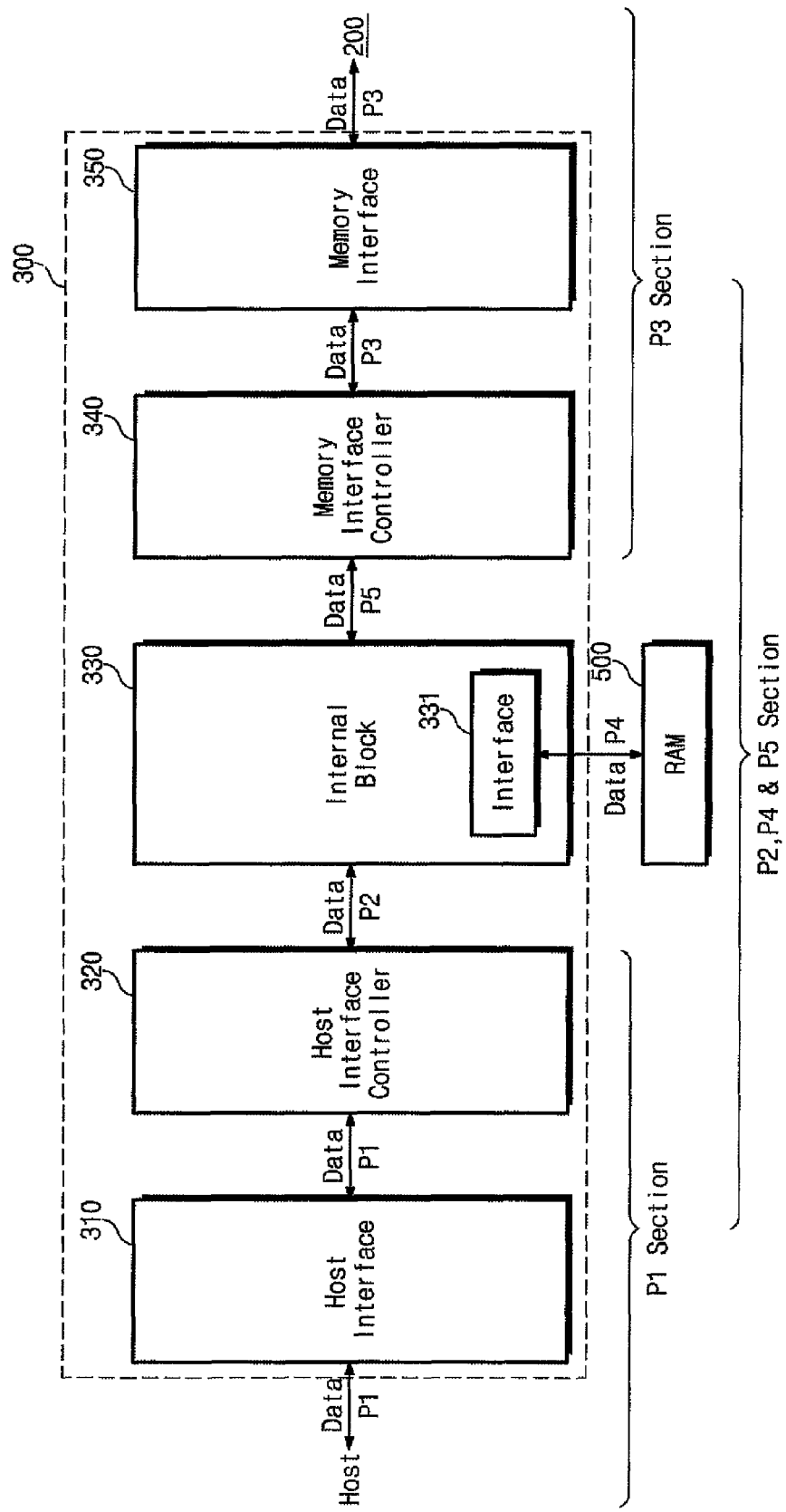
FIG. 8 is a block diagram illustrating a controller and a RAM of FIG. 7, according to an embodiment.

FIG. 8 is a block diagram illustrating the controller 300 and the RAM 500 of FIG. 7, according to an embodiment.

Referring to FIG. 8, the controller 300 is configured to communicate with the RAM 500.

The controller 300 includes a host interface 310, a host interface controller 320, an internal block 330, a memory interface controller 340, and a memory interface 350.

The host interface 310, the host interface controller 320 and the memory interface 350 are configured substantially the same as the host interface 110, the host interface controller 120 and the memory interface 150 described with reference to FIGS. 1 to 6. Thus, the detailed description will not be repeated for conciseness.

The memory interface controller 340 is configured to communicate with the internal block 330 and the memory interface 350. The memory interface controller 340 is also configured to exchange data and a fifth parity bit P5 with the internal block 330 and to exchange data and a third parity bit P3 with the memory interface 350. With the exception of exchanging the fifth parity bit P5 with the internal block 330, the memory interface controller 340 is configured substantially the same as the memory interface controller 140 described above with reference to FIGS. 1 to 6. For example, the memory interface controller 340 is configured to include a fifth parity control block instead of the second parity control block 145 described with reference to FIGS. 1 to 6.

The internal block 330 is configured to communicate with the host interface controller 320 and the memory interface controller 340. The internal block 330 is configured to exchange data and a second parity bit P2 with the host interface controller 320. The internal block 330 is configured to exchange data and a fifth parity bit P5 with the memory interface controller 340. That is, the internal block 330 generates a parity bit (e.g., the fifth parity bit P5 or the second parity bit P2) on the basis of received data, and checks an error in the received data by means of a received parity bit (e.g., the second parity bit P2 or the fifth parity bit P5).

The internal block 330 includes an interface 331. The interface 331 includes an interface for communication with the RAM 500. For example, data received from the memory device 200 are stored in the RAM 500 through the interface 331. The data stored in the RAM 500 may be transferred through the interface 331 to the host. Also, data received from the host may be stored in the RAM 500 through the interface 331. The data stored in the RAM 500 may be transferred through the interface 331 to the memory device 200. That is, the RAM 500 operates as a buffer memory between the host and the memory device 200.

For example, when a data request is received from the host, it is determined whether the requested data are present in the RAM 500. If the requested data are present in the RAM 500, the corresponding data are transferred from the RAM 500 through the interface 331 to the host. If the requested data are not present in the RAM 500, the corresponding data are stored in the RAM 500 through the interface 331 from the memory device 200. The corresponding data may then be transferred from the RAM 500 through the interface 331 to the host. That is, the RAM 500 operates as a cache memory.

As described above, the data read from the memory device 200 are stored in the RAM 500, and the data stored in the RAM 500 are transferred to the host. Also, the data received from the host are stored in the RAM 500, and the data stored in the RAM 500 are transferred to the memory device 200. That is, the RAM 500 and/or the interface 331 may be considered data discontinuity blocks.

The error detection sections may overlap each other in the RAM 500 to detect an error in the RAM 500 or the interface 331, which may be data discontinuity blocks.

For example, in FIG. 8, a first parity bit P1 may be used to detect an error generated in the host interface 310 and the host interface controller 320. A third parity bit P3 may be used to detect an error generated in the memory interface 350 and the memory interface controller 340. A second parity bit P2 may be used to detect an error generated in the host interface controller 320 and the internal block 330. A fifth parity bit P5 may be used to detect an error generated in the memory interface controller 340 and the internal block 330. A fourth parity bit P4 may be used to detect an error generated in the internal block 330 and the RAM 500.

Figure 9:
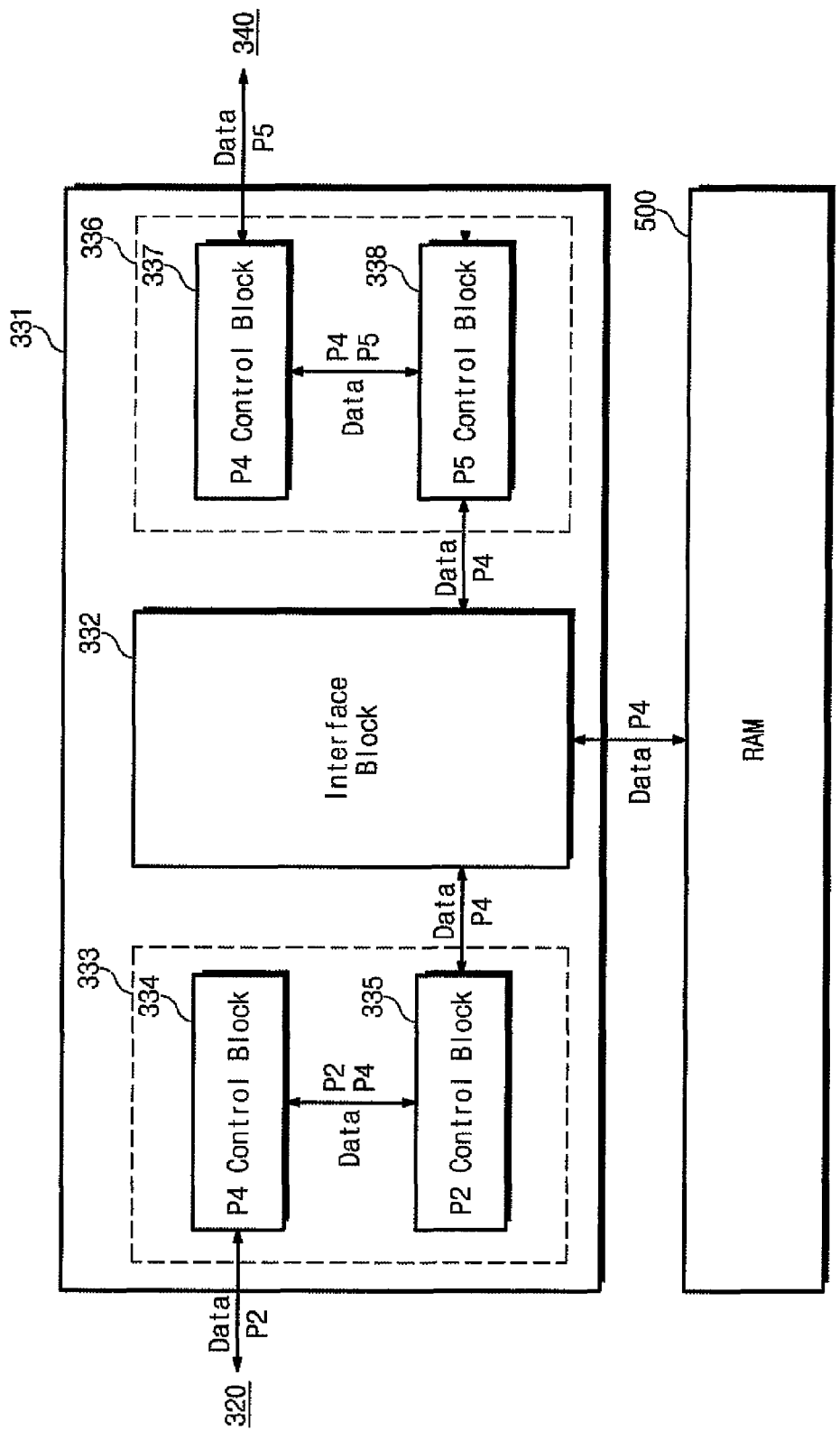
FIG. 9 is a block diagram illustrating an interface and a RAM of FIG. 8, according to an embodiment.

FIG. 9 is a block diagram illustrating the interface 331 and the RAM 500 of FIG. 8, according to an embodiment.

Referring to FIG. 9, the interface 331 includes an interface block 332, a first parity block 333, and a second parity block 336.

The interface block 332 is configured to communicate with the first parity block 333, the second parity block 336 and the RAM 500. The interface block 332 is configured to exchange data and a fourth parity bit P4 with the first parity block 333, to exchange data and the fourth parity bit P4 with the second parity block 336, and to exchange data and the fourth parity bit P4 with the RAM 500. The interface block 332 is also configured to selectively provide a channel between the first parity block 333 and the RAM 500 and a channel between the second parity block 336 and the RAM 500. For example, the interface block 332 includes a protocol for communication with the RAM 500.

The first parity block 333 is configured to communicate with the host interface controller 320 and the interface block 332. The first parity block 333 is configured to exchange data and a second parity bit P2 with the host interface controller 320, and to exchange data and a fourth parity bit P4 with the interface block 332. The first parity block 333 includes a fourth parity control block 334 and a second parity control block 335.

The fourth parity control block 334 is configured to generate the fourth parity bit P4 on the basis of the data received from the host interface controller 320. The data and the second and fourth parity bits P2 and P4 are transferred to the second parity control block 335. The fourth parity control block 334 is also configured to detect an error in the data received from the second parity control block 335, by means of the fourth parity bit P4 received from the second parity control block 335.

The second parity control block 335 is configured to detect an error in the data received from the fourth parity control block 334, by means of the second parity bit P2 received from the fourth parity control block 334. The second parity control block 335 is configured to generate a second parity bit P2 on the basis of the data received from the interface block 332. The data and the second and fourth parity bits P2 and P4 are transferred to the fourth parity control block 334.

The second parity block 336 is configured to communicate with the memory interface controller 340 and the interface block 332. The second parity block 336 is configured to exchange data and a fifth parity bit P5 with the memory interface controller 340. The second parity block 336 is configured to exchange data and a fourth parity bit P4 with the interface block 332. The second parity block 336 includes a fourth parity control block 337 and a fifth parity control block 338.

The fourth parity control block 337 is configured to generate the fourth parity bit P4 on the basis of the data received from the memory interface controller 340. The data and the fourth and fifth parity bits P4 and P5 are transferred to the fifth parity control block 338. The fourth parity control block 337 is also configured to detect an error in the data received from the fifth parity control block 338, by means of the fourth parity bit P4 received from the fifth parity control block 338.

The fifth parity control block 338 is configured to detect an error in the data received from the fourth parity control block 337, by means of the fifth parity bit P5 received from the fourth parity control block 337. The fifth parity control block 338 is also configured to generate a fifth parity bit P5 on the basis of the data received from the interface block 332. The data and the fourth and fifth parity bits P4 and P5 are transferred to the fourth parity control block 337.

In summary, the second parity bit P2 may be used to detect an error generated between the host interface controller 320 and the interface 331, which are data discontinuity blocks. The fifth parity bit P5 may be used to detect an error generated between the interface 331 and the memory interface controller 340, which are data discontinuity blocks. The fourth parity bit P4 may be used to detect an error generated in the interface 331 and the RAM 500, which are data discontinuity blocks. That is, errors generated between the data discontinuity blocks are detected separately from other error detection sections. Thus, the efficiency of detecting an error generated in the host interface controller 320, the interface 331, the RAM 500 and the memory interface controller 340 is improved, and the reliability of the controller 300 is improved.

It is understood that at least one error detection section may be omitted if the error rate of the host interface controller 320, the interface 331 and the RAM 500, which are data discontinuity blocks, is lower than a predetermined value. For example, data and a second parity bit P2 may be exchanged between the host interface controller 120 and the memory interface controller 140, as described with reference to FIGS. 1 to 6. The second parity bit P2 may be used to detect errors generated between the host interface controller 120 and the memory interface controller 140, including errors generated in the interface 331 and the RAM 500.

Figure 10:
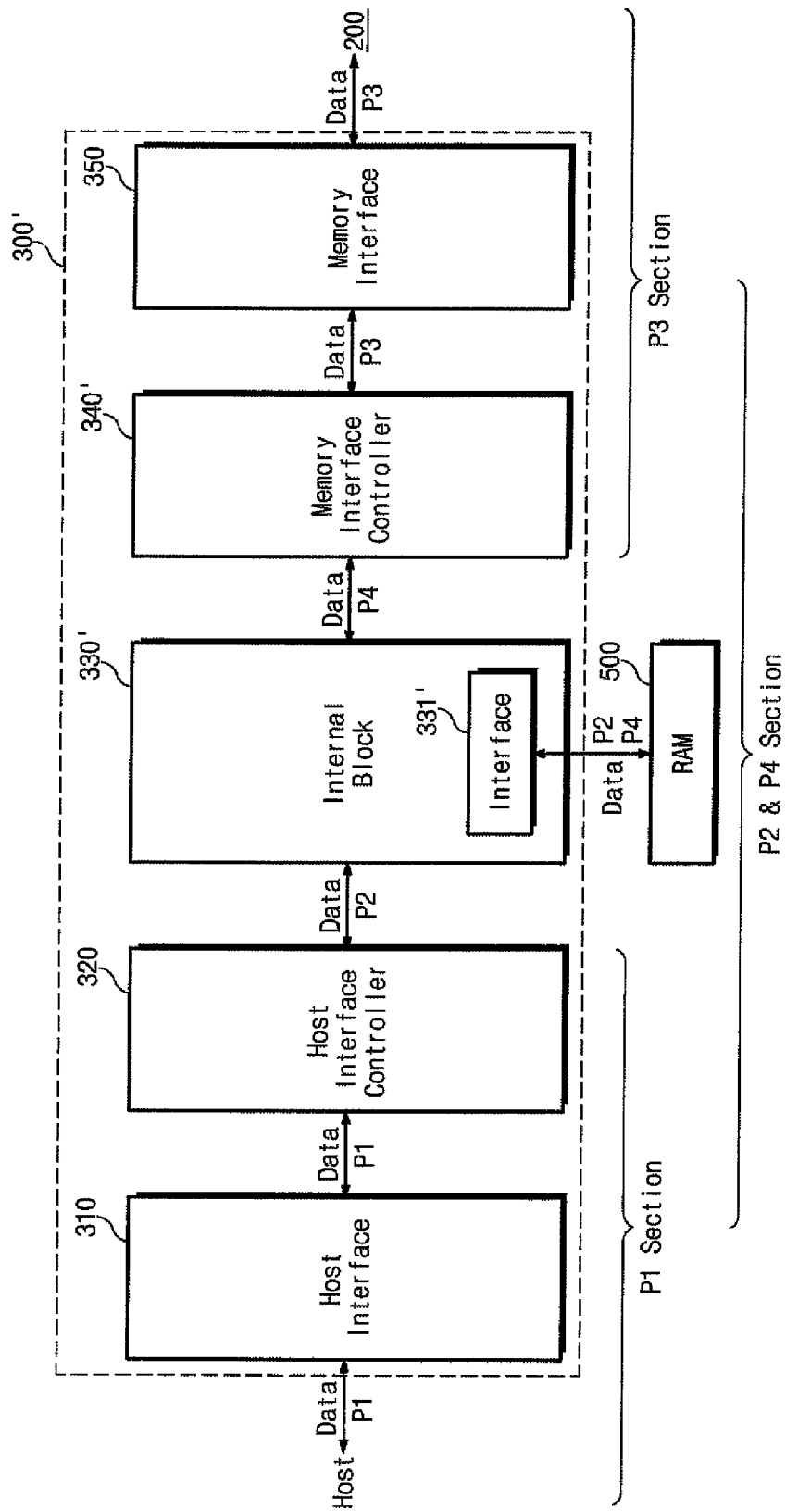
FIG. 10 is a block diagram illustrating a RAM and another embodiment of the controller of FIG. 7.

FIG. 10 is a block diagram illustrating the RAM 500 and another embodiment 300' of the controller 300 of FIG. 7.

Referring to FIG. 10, the controller 300' includes a host interface 310, a host interface controller 320, an internal block 330', a memory interface controller 340', and a memory interface 350.

The host interface 310, the host interface controller 320 and the memory interface 350 are configured substantially the same as described above with reference to FIGS. 7 to 9. Thus, the detailed description will not be repeated for conciseness.

With the exception of exchanging data and a fourth parity bit P4 with the internal block 330', the memory interface controller 340' operates substantially the same as the memory interface controller 340 described above with reference to FIGS. 7 to 9. For example, the memory interface controller 340' is configured to include a fourth parity control block instead of the second parity control block 145 described with reference to FIGS. 1 to 6.

The internal block 330' is configured to exchange data and a second parity bit P2 with the host interface controller 320. The internal block 330' is configured to exchange data and a fourth parity bit P4 with the memory interface controller 340'. The internal block 330' includes an interface 331' configured to communicate with the RAM 500.

Figure 11:
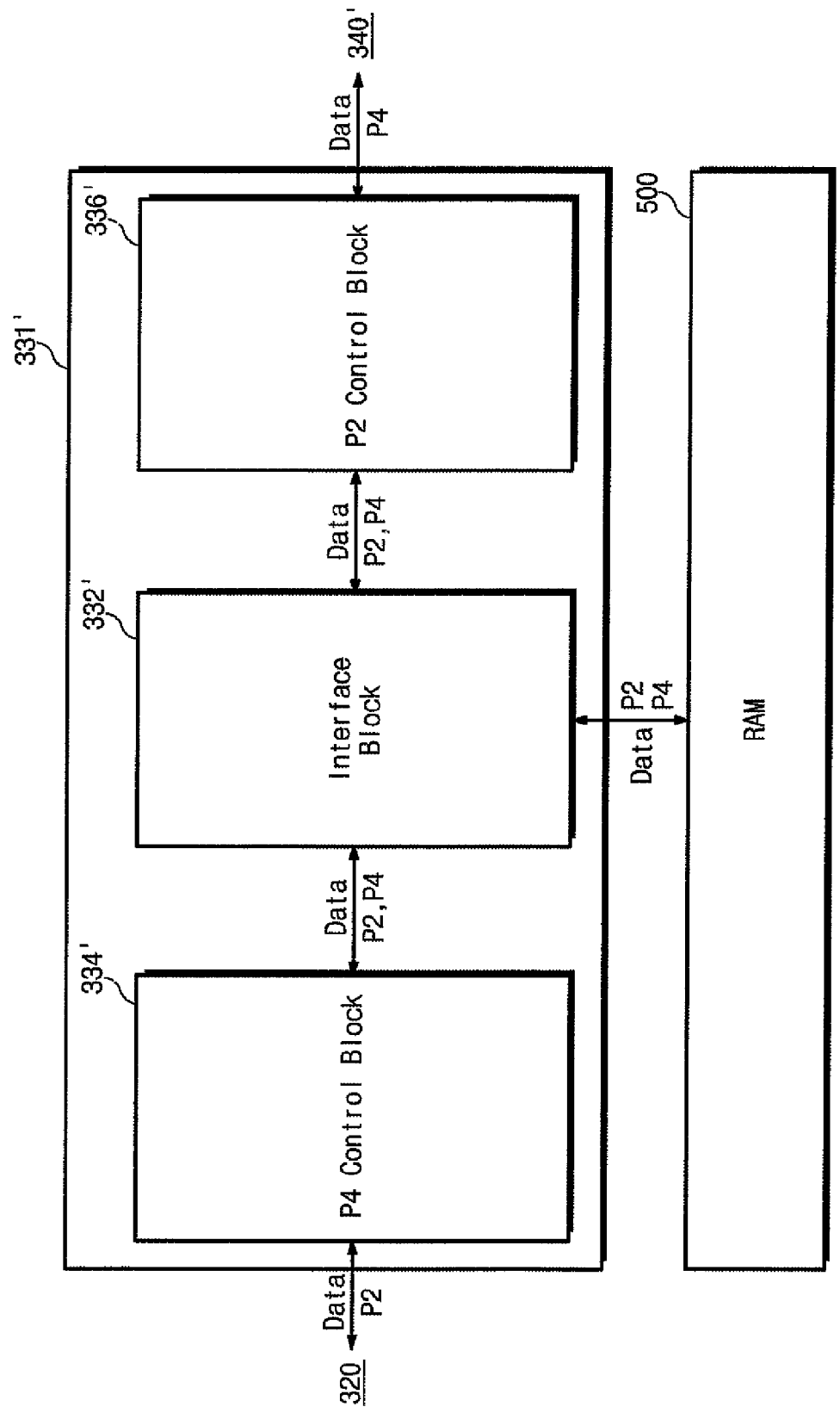
FIG. 11 is a block diagram illustrating an interface and a RAM of FIG. 10, according to an embodiment.

FIG. 11 is a block diagram illustrating the interface 331' and the RAM 500 of FIG. 10, according to an embodiment.

Referring to FIG. 11, the interface 331' includes an interface block 332', a fourth parity control block 334', and a second parity control block 336'.

The fourth parity control block 334' receives data and a second parity bit P2 from the host interface controller 320. The fourth parity control block 334' generates a fourth parity bit P4 on the basis of the received data. The data and the second and fourth parity bits P2 and P4 are stored in the RAM 500 through the interface block 332'.

The second parity control block 336' receives the data and the second and fourth parity bits P2 and P4 through the interface block 332' from the RAM 500. The second parity control block 336' detects an error in the received data by means of the received second parity bit P2. The data and the fourth parity bit P4 are transferred to the memory interface controller 340'.

The second parity control block 336' receives data and a fourth parity bit P4 from the memory interface controller 340'. The second parity control block 336' generates a second parity bit P2 on the basis of the received data. The data and the second and fourth parity bits P2 and P4 are stored in the RAM 500 through the interface block 332'.

The fourth parity control block 334' receives the data and the second and fourth parity bits P2 and P4 through the interface block 332' from the RAM 500. The fourth parity control block 334' detects an error in the received data by means of the received fourth parity bit P4. The data and the second parity bit P2 are transferred to the host interface controller 320.

As described with reference to FIGS. 10 and 11, the second parity bit P2 is used to detect an error in a data transmission section between the host interface controller 320 and the internal block 330'. The fourth parity bit P4 is used to detect an error in a data transmission section between the memory interface controller 340' and the internal block 330'. The error detection section using the second parity bit P2 and the error detection section using the fourth parity bit P4 overlap each other in the internal block 330'.

The error detection using the second parity bit P2 is performed after the data and the second parity bit P2 pass through the interface block 332' and the RAM 500, which are data discontinuity blocks. The error detection using the fourth parity bit P4 is performed after the data and the fourth parity bit P4 pass through the interface block 332' and the RAM 500, which are data discontinuity blocks. That is, an error generated in the data discontinuity blocks may be detected by overlapping the error detection sections in the data discontinuity blocks. Thus, the reliability of the controller 300' is improved.

Figure 12:
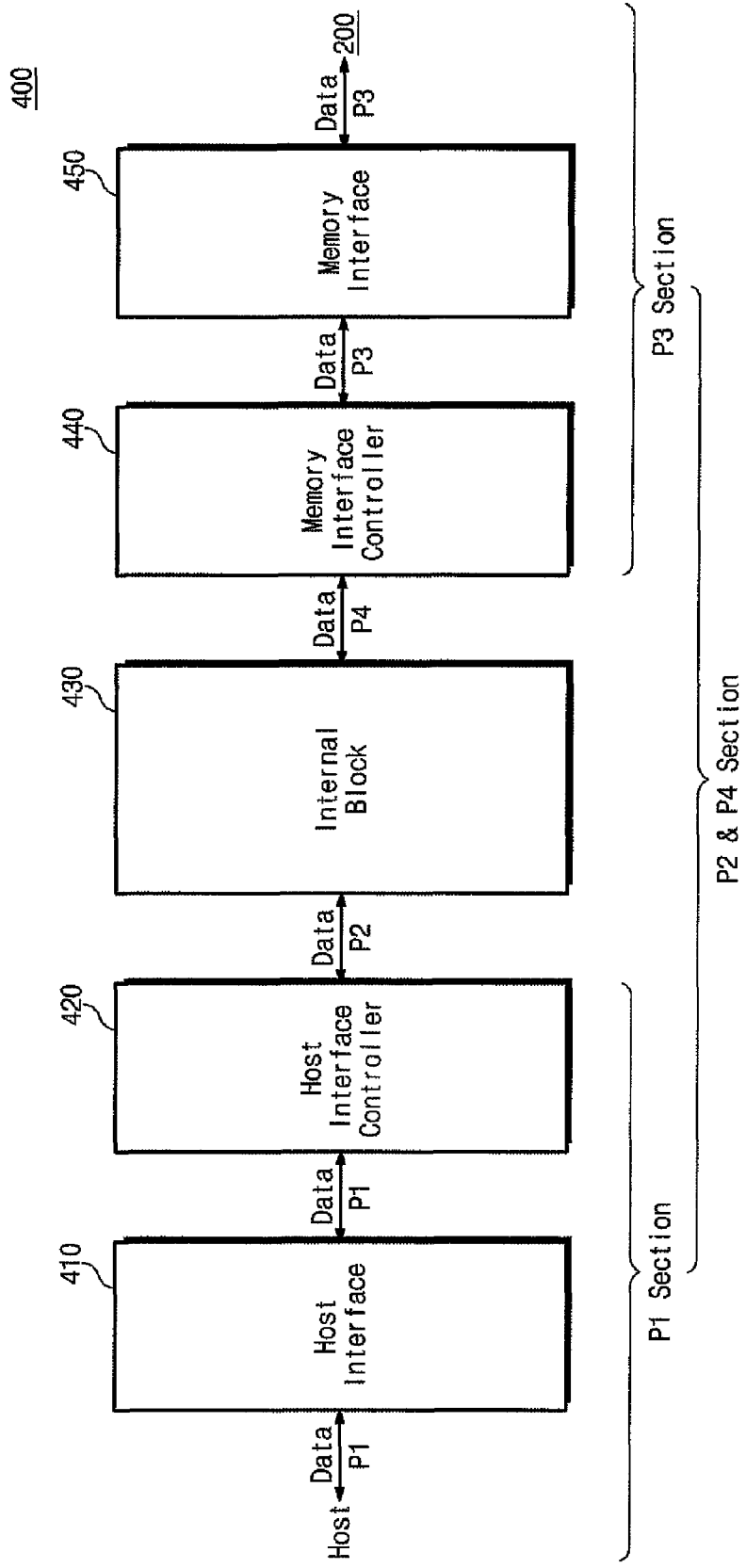
FIG. 12 is a block diagram illustrating a controller, which may be included as the controller of FIG. 1, according to an embodiment.

FIG. 12 is a block diagram illustrating a controller 400, which may be included as the controller 100 of FIG. 1, according to an embodiment.

Referring to FIG. 12, the controller 400 includes a host interface 410, a host interface controller 420, an internal block 430, a memory interface controller 440, and a memory interface 450.

The host interface 410, the host interface controller 420 and the memory interface 450 are configured substantially the same as the host interface 110, the host interface controller 120 and the memory interface 150 described above with reference to FIGS. 1 to 6. Thus, the detailed description will not be repeated for conciseness.

With the exception of exchanging data and a fourth parity bit P4 with the internal block 430, the memory interface controller 440 is configured substantially the same as the memory interface controller 140 described above with reference to FIGS. 1 to 6. For example, the memory interface controller 440 is configured to include a fourth parity control block instead of the second parity control block 145 described with reference to FIGS. 1 to 6.

The internal block 430 is configured to exchange data and a second parity bit P2 with the host interface controller 420.

The internal block 430 is also configured to exchange data and a fourth parity bit P4 with the memory interface controller 440.

The internal block 430 is configured to generate a fourth parity bit P4 on the basis of the data received from the host interface controller 420. The data and the fourth parity bit P4 are transferred to the memory interface controller 440. The internal block 430 is configured to detect an error in the data received from the host interface controller 420, by means of the second parity bit P2 received from the host interface controller 420.

The internal block 430 is also configured to generate a second parity bit P2 on the basis of the data received from the memory interface controller 440. The data and the second parity bit P2 are transferred to the host interface controller 420. The internal block 430 is configured to detect an error in the data received from the memory interface controller 440, by means of the fourth parity bit P4 received from the memory interface controller 440.

Figure 13:
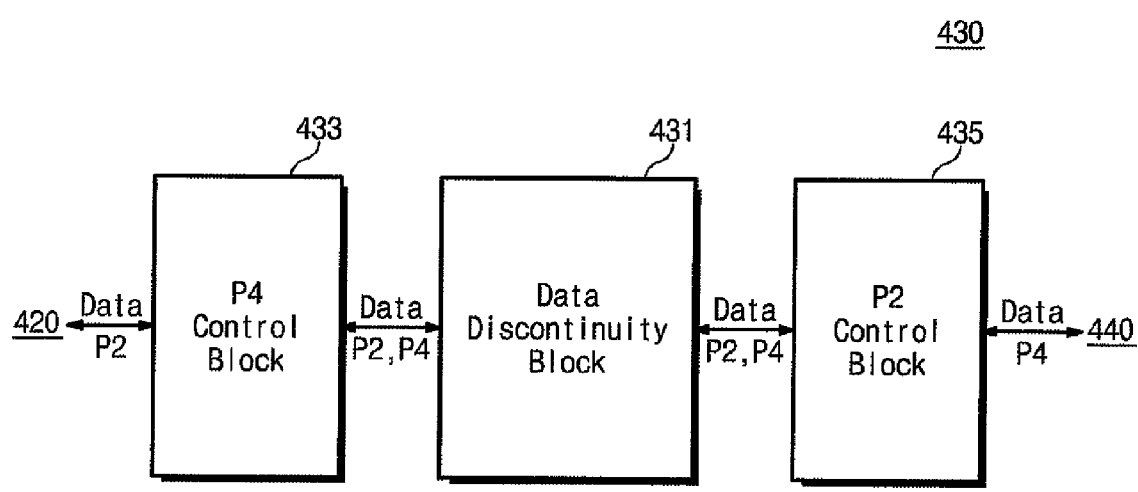
FIG. 13 is a block diagram illustrating an internal block of FIG. 12, according to an embodiment.

FIG. 13 is a block diagram illustrating the internal block 430 of FIG. 12, according to an embodiment.

Referring to FIG. 13, the internal block 430 includes a data discontinuity block 431, a fourth parity control block 433, and a second parity control block 435.

The data discontinuity block 431 is a block configured to process data discontinuously. For example, the data discontinuity block 431 may include a storage circuit configured to store data, such as a FIFO unit, a QUEUE unit, a register, a stack, a latch, a memory or an interface to a memory.

For example, the data discontinuity block 431 may include a circuit configured to normalize data. For example, the data discontinuity block 431 may include an interface configured to exchange data with the host in a first unit (e.g., a data access unit of the host) and exchange data with the memory device 200 in a second unit (e.g., a data access unit of the memory device 200). That is, the data discontinuity block 431 may include a data unit setting block (or circuit) which normalizes data exchanged with the host in a first data unit and data exchanged with the memory device 200 in a second data unit. The first unit may include a sector and a cluster, and the second unit may include a sector, a cluster, and page.

For example, the data discontinuity block 431 may include data conversion circuits, such as data encoding/decoding circuits and/or data encryption circuits. Also, for example, the data discontinuity block 431 may include an interface for communicating with an external RAM, as described with reference to FIGS. 7 to 11.

The fourth parity control block 433 is configured to exchange data and a second parity bit P2 with the host interface controller 420. The fourth parity control block 433 is also configured to exchange the data and second and fourth parity bits P2 and P4 with the data discontinuity block 431.

The fourth parity control block 433 is configured to generate a fourth parity bit P4 on the basis of the data received from the host interface controller 420. The data and the second and fourth parity bits P2 and P4 are transferred to the data discontinuity block 431. The fourth parity control block 433 is configured to detect an error in the data received from the data discontinuity block 431, by means of the fourth parity bit P4 received from the data discontinuity block 431.

The second parity control block 435 is configured to exchange data and a fourth parity bit P4 with the memory interface controller 440. The second parity control block 435 is also configured to exchange data and second and fourth parity bites P2 and P4 with the data discontinuity block 431.

The second parity control block 435 is configured to generate a second parity bit P2 on the basis of the data received from the memory interface controller 440. The data and the second and fourth parity bits P2 and P4 are transferred to the data discontinuity block 431. The second parity control block 435 is configured to detect an error in the data received from the data discontinuity block 431, by means of the second parity bit P2 received from the data discontinuity block 431.

That is, the error detection section using the second parity bit P2 and the error detection section using the fourth parity bit P4 overlap each other in the data discontinuity block 431. Thus, an error generated in the data discontinuity block 431 can be detected, and the reliability of the controller 400 is improved.

As described above, an error generated between the data discontinuity blocks may be detected separately from other error detection sections. Also, the error detection sections may be configured to overlap each other in the data discontinuity blocks. It is understood that the configurations of the error detection sections of the controller 100/300/400 may be selected on the basis of the error rate in the data discontinuity block.

For example, in the data discontinuity block, the sequence or information of the received data may be changed prior to output. In this case, it may be impossible to check an error in the output data by means of the parity bit received from the previous block.

Also, it is assumed that a parity bit and data are received from the previous block and the received data are encoded using an encryption technique. In this case, it may be impossible to detect an error in the encoded data by means of the parity bit received from the previous block. An encoding/decoding operation incapable of detecting a data error by means of the parity bit received from the previous block will be referred to as a discontinuous encoding/decoding operation. Also, a block performing a discontinuous encoding/decoding operation will be referred to as a discontinuous encoder/decoder.

Figure 14:
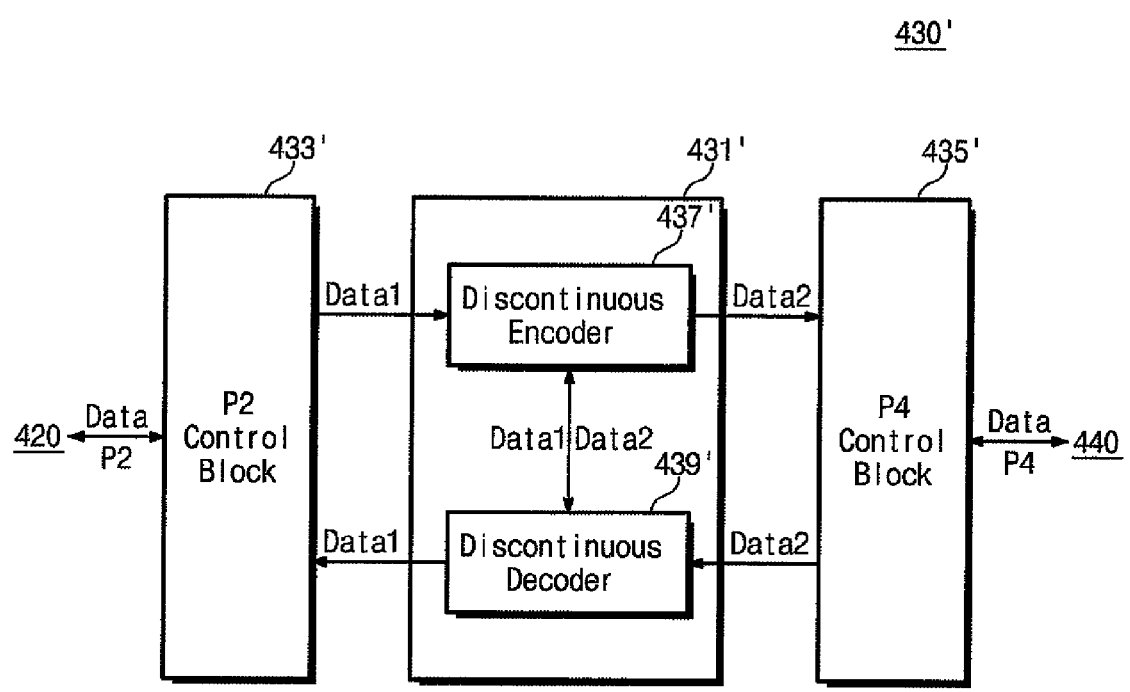
FIG. 14 is a block diagram illustrating an internal block of FIG. 12, according to another embodiment.

FIG. 14 is a block diagram illustrating internal block 430' as another embodiment of the internal block 430 of FIG. 12.

Referring to FIG. 14, the internal block 430' includes a data discontinuity block 431', a second parity control block 433', and a fourth parity control block 435'. The data discontinuity block 431' includes a discontinuous encoder 437' and a discontinuous decoder 439'.

A process for transferring data from the host interface controller 420 through the internal block 430' to the memory interface controller 440 is described below.

The second parity control block 433' receives data and a second parity bit P2 from the host interface controller 420. The second parity control block 433' may check an error in the received data by means of the received second parity bit P2.

The second parity control block 433' outputs the received data as first data Data1. The first data Data1 are transferred to the discontinuous encoder 437'. The discontinuous encoder 437' encodes the received first data Data1 discontinuously, and outputs the discontinuously encoded first data Data1 as second data Data2. The second data Data2 are transferred to the fourth parity control block 435' and the discontinuous decoder 439'. The fourth parity control block 435' generates a fourth parity bit P4 on the basis of the received second data Data2. The fourth parity control block 435' transfers the second data Data2 and the fourth parity bit P4 to the memory interface controller 440.

The discontinuous decoder 439' receives the second data Data2 from the discontinuous encoder 437'. The discontinuous decoder 439' decodes the received second data Data2, and outputs the decoded second data Data2 as first data Data1. The first data Data1 are transferred to the second parity control block 433'. The second parity control block 433' detects an error in the received first data Data1 by means of the received second parity bit P2.

A process for transferring data from the memory interface controller 440 through the internal block 430' to the host interface controller 420 is described below.

The fourth parity control block 435' receives data and a fourth parity bit P4 from the memory interface controller 440. The fourth parity control block 435' may detect an error in the received data by means of the received fourth parity bit P4. The fourth parity control block 435' outputs the received data as second data Data2. The second data Data2 are transferred to the discontinuous decoder 439'.

The discontinuous decoder 439' decodes the received second data Data2, and outputs the decoded second data Data2 as first data Data1. The first data Data1 are transferred to the second parity control block 433' and the discontinuous encoder 437'.

The second parity control block 433' generates a second parity bit P2 on the basis of the received first data Data1. The second parity control block 433' transfers the first data Data1 and the second parity bit P2 to the host interface controller 420.

The discontinuous encoder 437' receives the first data Data1 from the discontinuous decoder 439'. The discontinuous encoder 437' encodes the received first data Data1. The discontinuous encoder 437' outputs the encoded first data Data1 as second data Data2. The second data Data2 are transferred to the fourth parity control block 435'.

The fourth parity control block 435' receives the second data Data2 from the discontinuous encoder 437. The fourth parity control block 435' detects an error in the second data Data2 received from the discontinuous encoder 437' by means of the fourth parity bit P4 received from the memory interface controller 440.

As described above, the discontinuously encoded data are discontinuously decoded prior to error check. The discontinuously decoded data are discontinuously encoded prior to error check. Thus, the error detection sections may overlap each other in the discontinuous encoder/decoder. The error detection performance of the controller 400 and the reliability of the controller 400 are improved FIG. 15 is a block diagram illustrating the memory device 200 of FIG. 1, according to an embodiment.

Figure 15:
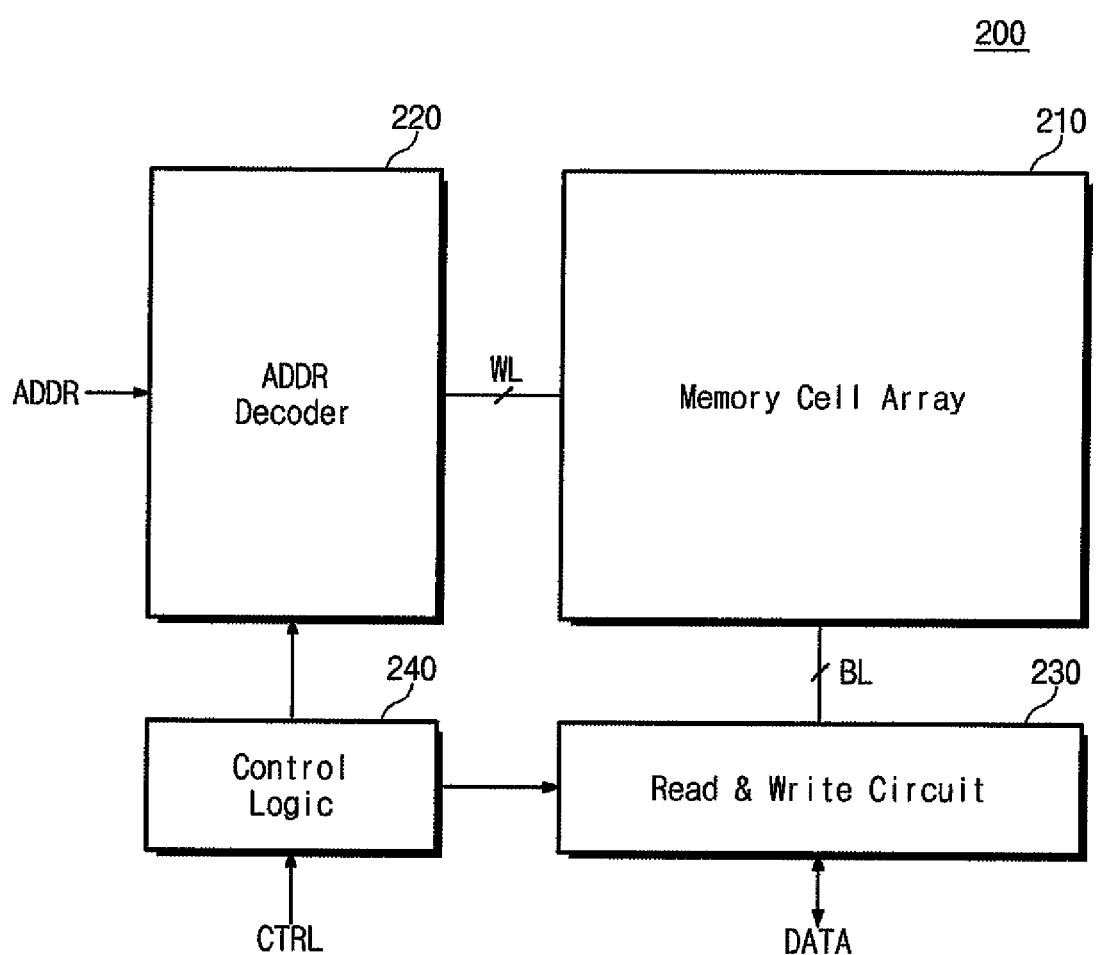
FIG. 15 is a block diagram illustrating a memory device of FIG. 1, according to an embodiment.

Referring to FIG. 15, the memory device 200 includes a memory cell array 210, an address decoder 220, a read/write circuit 230, and a control logic circuit 240.

The memory cell array 210 is connected through word lines WL to the address decoder 220 and is connected through bit lines BL to the read/write circuit 230. The memory cell array 210 may include multiple memory cells, for example, where rows of the memory cells are connected to the word lines WL and columns of the memory cells are connected to the bit lines BL. For example, the memory cells may be configured to store one or more bits per cell. Also, the memory cell array 210 may include multiple semiconductor memory cells.

The address decoder 220 is connected through the word lines WL to the memory cell array 210. The address decoder 220 operates in response to the control of the control logic circuit 240. The address decoder 220 receives an address ADDR from an external device. For example, the address ADDR may be received from the controller 100/300/400, described above with reference to FIGS. 1 to 14.

The address decoder 220 decodes a row address among the received addresses ADDR to select the word lines WL. The address decoder 220 decodes a column address among the received addresses ADDR and transfers the same to the read/write circuit 230. The address decoder 220 may include a row decoder, a column decoder, and an address buffer, for example.

The read/write circuit 230 is connected through the bit lines BL to the memory cell array 210. The read/write circuit 230 is configured to exchange data with an external device. For example, the read/write circuit 230 may exchange data with the controller 100/300/400, described above with reference to FIGS. 1 to 14.

The read/write circuit 230 operates in response to the control of the control logic circuit 240. The read/write circuit 230 receives the decoded column address from the address decoder 220 to select the bit lines BL.

The read/write circuit 230 may receive data from an external device and write the received data in the memory cell array 210, and/or read data from the memory cell array 210 and output the read data to an external device. Also, the read/write circuit 230 may read data from a first storage region of the memory cell array 210 and write the read data in a second storage region of the memory cell array 210. The read/write circuit 230 may also perform a copy-back operation.

The read/write circuit 230 may include a page buffer, a column selection circuit, and a data buffer, for example. Also, the read/write circuit 230 may include a sense amplifier, a write driver, a column selection circuit, and a data buffer, for example.

The control logic circuit 240 is connected to the address decoder 220 and the read/write circuit 230. The control logic circuit 240 controls an overall operation of the memory device 200. The control logic circuit 240 operates in response to a control signal CTRL received from an external device. For example, the control signal CTRL may be received from the controller 100/300/400, described above with reference to FIGS. 1 to 14.

The memory device 200 may be configured to store data in semiconductor memory cells, on a storage medium such as a disk-type storage, and/or on an optical disk, for example.

Figure 16:
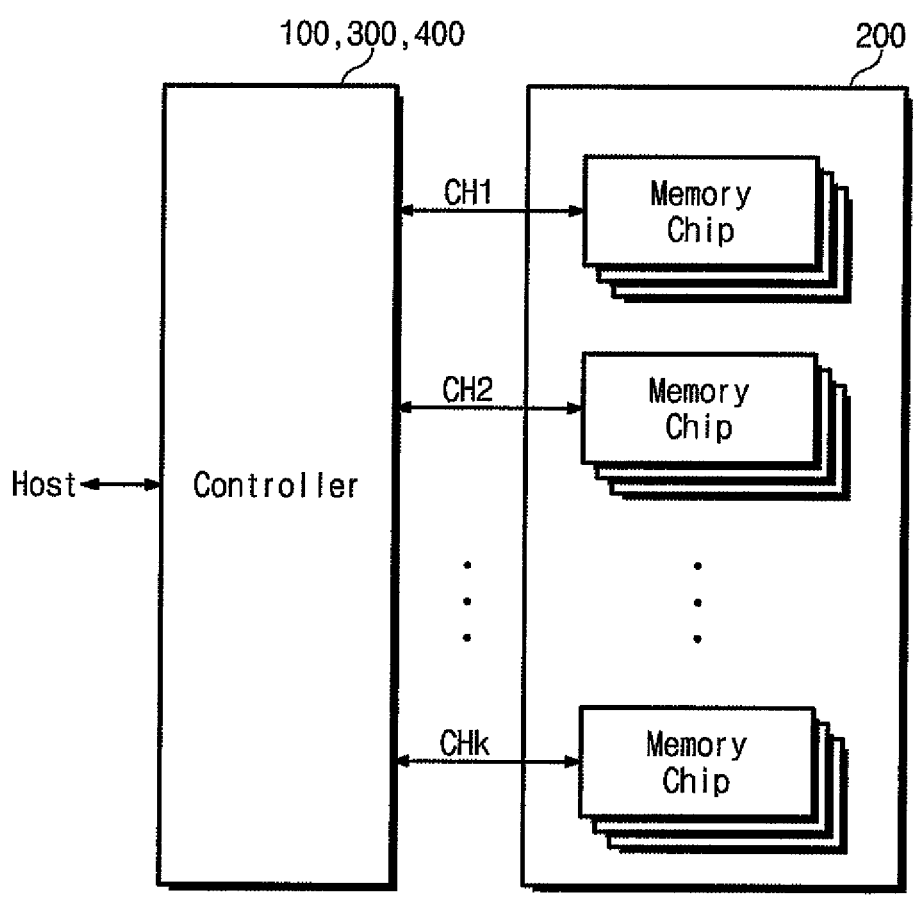
FIG. 16 is a block diagram of a memory system, which may be included as the memory system of FIG. 1, according to an embodiment.

FIG. 16 is a block diagram illustrating a memory system 30, which may be included as the memory system 10 of FIG. 1, according to an embodiment.

Referring to FIG. 16, the memory system 30 includes a controller 100/300/400 and a memory device 200.

The controller 100/300/400 is configured to operate substantially the same as described above with reference to FIGS. 1 to 14.

The memory device 200 includes multiple memory chips. The memory chips form multiple memory chip groups. Each of the memory chip groups has a channel for communication with the controller 100/300/400. For example, it is illustrated in FIG. 16 that the memory device 200 communicates with the controller 100/300/400 through 'k' channels. Each of the memory chips may be configured substantially the same as described above with reference to FIG. 15.

It is understood that the controller 100/300/400 and the memory device 200 may constitute a memory card or a solid state drive (SSD), as described above with reference to FIG. 1.

Figure 17:
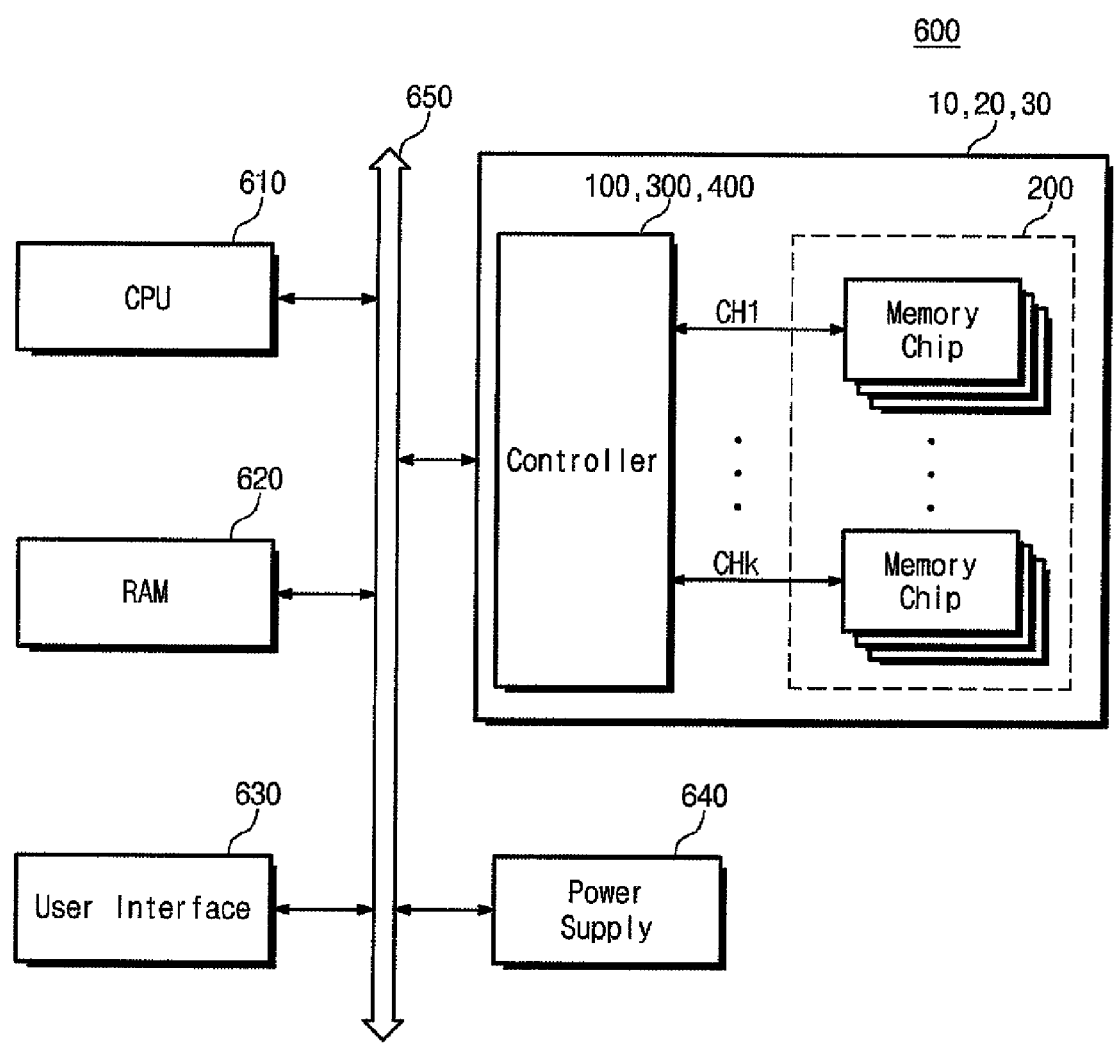
FIG. 17 is a block diagram of a computing system, including the memory system of FIG. 1, 7 or 16, according to an embodiment.

FIG. 17 is a block diagram of a computing system 600, including the memory system 10, 20 or 30 of FIG. 1, 7 or 16, according to an embodiment.

Referring to FIG. 17, a computing system 600 according to an embodiment of the inventive concept includes a central processing unit (CPU) 610, a random access memory (RAM) 620, a user interface 630, a power supply 640, and a memory system 10/20/30.

The memory system 10/20/30 is electrically connected through a system bus 650 to the CPU 610, the RAM 620, the user interface 630, and the power supply 640. Data, which are provided through the user interface 630 or processed by the CPU 610, are stored in the memory system 10/20/30. The memory system 10/20/30 includes a controller 100/300/400 and a memory device 200, as discussed above.

When the memory system 10/20/30 is provided for a solid state drive (SSD), the booting speed of the computing system 600 may increase substantially. Although not illustrated in FIG. 17, it would be apparent to one skilled in the art that the computing system 600 may further include an application chipset, a camera image processor, and the like.

According to embodiments of the inventive concept, the controller 100/300/400 has one or more error detection sections, and the error detection sections overlap each other in the data discontinuity block of the controller 100/300/400. Thus, an error in the data discontinuity section can be detected, improving the reliability of the controller 100/300/400.

According to embodiments of the inventive concept, the controller 100/300/400 has one or more error detection sections, and an error in the data discontinuity block can be detected separately from other error detection sections. Thus, an error in the data discontinuity section can be detected, improving the reliability of the controller 100/300/400.

The reliability of the controller 100/300/400 increases with an increase in the number of error detection sections in the controller 100/300/400. On the other hand, the complexity of the controller 100/300/400 increases with an increase in the number of error detection sections in the controller 100/300/400. Thus, the number of error detection sections in the memory controller 100/300/400 may be selected considering the desired reliability and complexity of the memory controller 100/300/400.

According to the inventive concept described above, the memory controller is able to detect an error in data transmission, thus improving its reliability.

The above-disclosed subject matter is to be considered illustrative and not restrictive, and the appended claims are intended to cover all such modifications, enhancements, and other embodiments, which fall within the spirit and scope of the inventive concept. While the present inventive concept has been described with reference to exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A memory controller comprising:
   first and second interface controllers configured to exchange data with external devices; and
   an internal block connected between the first and second interface controllers,
   wherein the first and second interface controllers exchange data received from the external devices and at least one parity bit corresponding to the received data through the internal block,
   wherein each of the first and second interface controllers is configured to generate at least one parity bit corresponding to the received data and to transmit the received data and the corresponding at least one parity bit to the internal block, and to receive at least one external parity bit corresponding to the received data, and
   wherein a section for transmission of the received at least one external parity bit and a section for transmission of the generated at least one parity bit have an overlapping section on a signal path in each of the first and second interface controllers.

2. The memory controller of claim 1, wherein
   the internal block comprises first and second signal paths, the received data being transmitted on the first signal path with at least one first parity bit and the received data being transmitted on the second signal path with at least one second parity bit, and
   the first signal path and the second signal path having an overlapping section.

3. The memory controller of claim 2, wherein the overlapping section of the internal block includes a data discontinuity block.

4. The memory controller of claim 3, wherein the data discontinuity block comprises an interface for exchanging data with an external device.

5. The memory controller of claim 3, wherein the data discontinuity block comprises a data unit setting block.

6. The memory controller of claim 3, wherein the data discontinuity block comprises a data encoding/decoding circuit.

7. The memory controller of claim 3, wherein the data discontinuity block comprises a storage circuit.

8. The memory controller of claim 1, wherein the internal block comprises
   a first parity control block configured to receive first data and at least one first parity bit from the first interface controller and decode the received at least one parity bit; and
   a data encoding/decoding block configured to encode the received first data and decode the encoded first data,
   wherein the first parity control block is further configured to check the decoded first data according to the received at least one parity bit.

9. The memory controller of claim 8, wherein the internal block further comprises
   a second parity control block configured to generate at least one second parity bit based on the encoded first data and transmit the encoded first data and the generated at least one second parity bit to the second interface controller.

10. The memory controller of claim 9, wherein the second parity control block is further configured to receive second data and at least one third parity bit from the second interface controller and decode the received at least one third parity bit, the data encoding/decoding block is further configured to decode the received second data and encode the decoded second data, and the second parity control block is further configured to check the encoded second data according to the received at least one third parity bit.

11. The memory controller of claim 10, wherein the first parity control block is further configured to generate at least one fourth parity bit based on the decoded second data and transmit the decoded second data and the generate at least one fourth parity bit to the first interface controller.

12. A memory system comprising:
   a memory device; and
   a controller configured to control the memory device, the controller comprising:
   first and second interface controllers configured to exchange data with external devices; and
   an internal block connected between the first and second interface controllers,
   wherein the first and second interface controllers exchange data and parity bits corresponding to received data between the external devices and the internal block, and
   wherein the first and second interface controllers include a first parity control block configured to receive data and a first parity bit, generate a second parity bit according to the received data, and forward the received data and the first and second parity bits to a buffer, and a second parity control block configured to receive the buffered data and the first and second parity bits from the buffer, correct the buffered data using the first parity bit if necessary, and forward the corrected data with the second parity bit.

13. The memory system of claim 12, wherein the memory device and the controller composes a solid state drive (SSD).

14. The memory system of claim 12, wherein the memory device and the controller composes a memory card.

\* \* \* \* \*